United States Patent
Lee et al.

(10) Patent No.: US 12,066,725 B2
(45) Date of Patent: Aug. 20, 2024

(54) DISPLAY DEVICE

(71) Applicant: Samsung Display Co., Ltd., Yongin-si (KR)

(72) Inventors: Sang Hoon Lee, Hwaseong-si (KR); Seung Min Song, Gwangju (KR); Min Joo Kim, Bucheon-si (KR); Tae Woo Kim, Seoul (KR); Jong Hyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1007 days.

(21) Appl. No.: 16/928,816

(22) Filed: Jul. 14, 2020

(65) Prior Publication Data

US 2021/0126078 A1    Apr. 29, 2021

(30) Foreign Application Priority Data

Oct. 28, 2019    (KR) .................... 10-2019-0134377

(51) Int. Cl.
| | | |
|---|---|---|
| *G02F 1/1345* | (2006.01) | |
| *G06F 3/041* | (2006.01) | |
| *G06V 40/19* | (2022.01) | |
| *G09G 3/3233* | (2016.01) | |
| *H04N 23/57* | (2023.01) | |

(Continued)

(52) U.S. Cl.
CPC ........ *G02F 1/13452* (2013.01); *G02F 1/1345* (2013.01); *G06F 3/0412* (2013.01); *G06F 3/0416* (2013.01); *G06V 40/19* (2022.01); *G09G 3/3233* (2013.01); *G09G 2300/0819* (2013.01); *G09G 2300/0842* (2013.01); *G09G 2300/0861* (2013.01); *H04N 23/57* (2023.01); *H10K 59/131* (2023.02); *H10K 59/88* (2023.02)

(58) Field of Classification Search
CPC .......................... G02F 1/1345; G02F 1/13452
See application file for complete search history.

(56) References Cited

U.S. PATENT DOCUMENTS

| | | |
|---|---|---|
| 2017/0294502 A1 | 10/2017 | Ka et al. |
| 2018/0190710 A1 | 7/2018 | Ryu et al. |

(Continued)

FOREIGN PATENT DOCUMENTS

| | | |
|---|---|---|
| EP | 2 584 767 A1 | 4/2013 |
| EP | 3 537 693 A1 | 9/2019 |
| KR | 10-2017-0117291 A | 10/2017 |

OTHER PUBLICATIONS

Extended European Search Report dated Jul. 2, 2021 for corresponding European Application No. 20204226.3 (10 pages).

*Primary Examiner* — Dung T Nguyen
(74) *Attorney, Agent, or Firm* — Lewis Roca Rothgerber Christie LLP

(57) ABSTRACT

A display device includes a display panel including a display area in which pixels are placed to display an image, and a non-display area located around the display area; and a cover window including a light blocking area overlapping the non-display area of the display panel in a thickness direction of the display panel, and a through hole penetrating through the light blocking area, wherein the display panel further includes a first power supply line located in the non-display area to apply a first power supply voltage, and wherein the first power supply line does not overlap the through hole in the thickness direction of the display panel.

22 Claims, 15 Drawing Sheets

(51) Int. Cl.
    *H10K 59/131* (2023.01)
    *H10K 59/88* (2023.01)

(56) References Cited

U.S. PATENT DOCUMENTS

2019/0304366 A1* 10/2019 Ka .................... G02F 1/13452
2019/0318693 A1  10/2019 Jung et al.

* cited by examiner

DISPLAY DEVICE

CROSS-REFERENCE TO RELATED APPLICATION

This application claims priority to and the benefit of Korean Patent Application No. 10-2019-0134377 filed on Oct. 28, 2019 in the Korean Intellectual Property Office, the entire content of which is herein incorporated by reference.

BACKGROUND

1. Field

The present disclosure relates to a display device.

2. Description of the Related Art

With the development of the increase flow of information in the society, requirements for display devices for displaying images have increased in various forms. For example, display devices are applied to various electronic appliances such as smart phones, digital cameras, notebook computers, navigators, and smart televisions.

As display devices are applied to various electronic devices, display devices having various functions and designs are required. For example, in order to enlarge a display area, display devices in each which through holes are arranged in the display area and optical sensors such as a camera sensor and an infrared sensor are arranged in the through holes have been commercially available. Alternatively, display devices in which an optical sensor such as an infrared sensor is disposed in a display area without through holes have been commercially available.

When the optical sensor is disposed in the through hole disposed in the display area, wirings must be arranged to avoid the through hole, so that it is difficult to design the wirings. Further, aesthetic feelings may deteriorate due to the through holes.

When the optical sensor is disposed in the display area without through holes, in order to increase transmittance, the resolution of the display area where the optical sensor is disposed may be lower than the resolution of the display area where the optical sensor is not disposed.

SUMMARY

Aspects of embodiments of the present disclosure provide a display device, which can prevent (or reduce) the deterioration of aesthetic feelings due to through holes and the deterioration of the resolution of a display area where an optical sensor is disposed.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

One or more example embodiments of the present disclosure provide a display device including a display panel including a display area in which pixels are arranged to display an image, and a non-display area located around the display area; and a cover window including a light blocking area overlapping the non-display area of the display panel in a thickness direction of the display panel, and a through hole penetrating through the light blocking area. The display panel further includes a first power supply line disposed in the non-display area to apply a first power supply voltage. The first power supply line does not overlap the through hole in the thickness direction of the display panel.

In some embodiments, the display panel further includes scan lines arranged in the display area and connected to the pixels; and scan stages arranged in the non-display area and connected to the scan lines to apply scan signals. In some embodiments, the scan stages include first scan stages overlapping the through hole in the thickness direction of the display panel; and second scan stages not overlapping the through hole in the thickness direction of the display panel. In some embodiments, wherein the first power supply line overlaps the second scan stages in the thickness direction of the display panel. In some embodiments, wherein the first power supply line does not overlap the first scan stages in the thickness direction of the display panel. In some embodiments, the display panel further includes dummy scan stages located between corresponding scan stages adjacent to each other in one direction from among the scan stages in the non-display area.

In some embodiments, wherein the dummy scan stages overlap the through hole in the thickness direction of the display panel. In some embodiments, wherein the first power supply line does not overlap the dummy scan stages. In some embodiments, wherein the dummy scan stages do not overlap the through hole in the thickness direction of the display panel. In some embodiments, wherein a length of any one of the first scan stages in one direction is longer than a length of any one of the second scan stages in the one direction, and wherein a length of any one of the first scan stages in the other direction is shorter than a length of any one of the second scan stages in the other direction crossing the one direction.

In some embodiments, the display panel further includes light emission lines connected to the pixels and located in the display area; and light emission stages connected to the light emission lines to apply light emission signals. In some embodiments, the light emission stages include first light emission stages overlapping the through hole in the thickness direction of the display panel; and second light emission stages not overlapping the through hole in the thickness direction of the display panel. In some embodiments, the first power supply line overlaps the second light emission stages in the thickness direction of the display panel.

In some embodiments, wherein the first power supply line does not overlap the first light emission stages. In some embodiments, a length of any one of the first light emission stages in one direction is longer than a length of any one of the second light emission stages in the one direction, and wherein a length of any one of the first light emission stages in the other direction is shorter than a length of any one of the second light emission stages in the other direction crossing the one direction. In some embodiments, the display panel further includes dummy light emission stages located between corresponding light emission stages adjacent to each other in one direction from among the light emission stages in the non-display area. In some embodiments, the dummy light emission stages do not overlap the through hole in the thickness direction of the display panel. In some embodiments, the dummy light emission stages overlap the through hole in the thickness direction of the display panel.

In some embodiments, the first power supply line does not overlap the dummy light emission stages in the thickness direction of the display panel. In some embodiments, the through hole overlaps a corner of the display panel in the thickness direction of the display panel. In some embodiments, the display device further includes a sensor device overlapping the through hole in the thickness direction of the display panel and sensing light.

One or more example embodiments of the present disclosure provide a display device including a display panel including a display area in which pixels are placed to display an image, and a non-display area located around the display area; and a sensor device overlapping the non-display area of the display panel in a thickness direction of the display panel to sense light. The display panel further includes a first power supply line located in the non-display area to apply a first power supply voltage. The first power supply line does not overlap the sensor device in the thickness direction of the display panel.

In some embodiments, the display device further includes a cover window including a light blocking area overlapping the non-display area of the display panel in the thickness direction of the display panel, and a through hole penetrating through the light blocking area, wherein the through hole overlaps the sensor device in the thickness direction of the display panel.

According to some embodiments of the present disclosure, a through hole penetrates through the light blocking area of the cover window and overlaps the non-display area of the display panel. That is, because the through hole is not disposed in the display area of the display panel, it is possible to prevent (or reduce) the deterioration of aesthetic feelings due to the through holes disposed in the display area of the display panel.

Further, because the through hole is not disposed in the display area of the display panel, wiring design may be easy.

Further, because the sensor devices does not need to be disposed to overlap the display area of the display panel in the third direction (Z-axis direction), it is not needed to remove pixels due to the through hole. Therefore, it is possible to prevent (or reduce the chance of) the resolution of the display area of the display panel from being lowered.

Aspects of embodiments of the present disclosure are not limited to the aforementioned aspects, and various other aspects are included in the present disclosure (specification).

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
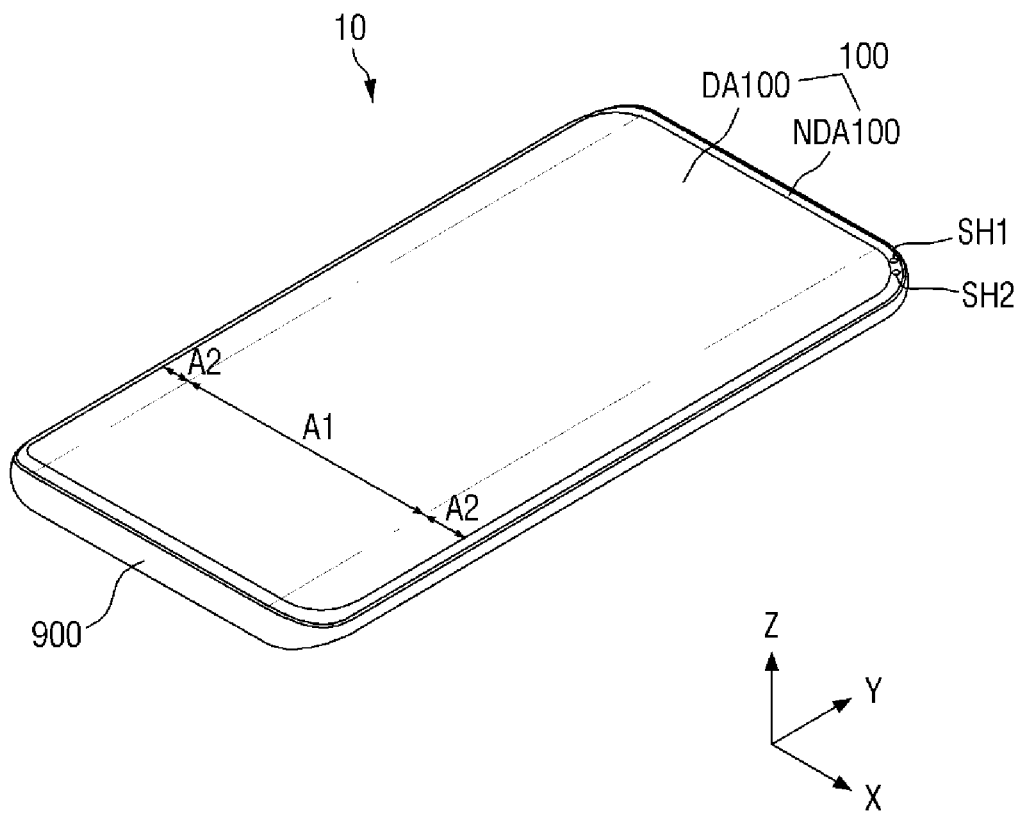
FIG. 1 is a perspective view of a display device according to some example embodiments of the present disclosure.

The present disclosure will now be described more fully hereinafter with reference to the accompanying drawings, in which example embodiments of the present disclosure are shown. The present disclosure may, however, be embodied in different forms and should not be construed as limited to the embodiments set forth herein. Rather, these embodiments are provided so that this disclosure will be thorough and complete, and will fully convey the aspects and features of the disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." In addition, the use of alternative language, such as "or," when describing embodiments of the present disclosure, refers to "one or more embodiments of the present disclosure" for each corresponding item listed. As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein.

Hereinafter, embodiments of the present disclosure are described with reference to the attached drawings.

Although a display device (e.g., display device 10 of FIG. 1) according to example embodiments of the present specification (or disclosure) has been described with reference to being applied to a smart phone, the present disclosure is not limited thereto. For example, the display device (e.g., display device 10 of FIG. 1) according to example embodiments of the present specification (or disclosure) may be applied to portable phones in addition to smart phones, tablet PCs, personal digital assistants (PDAs), portable multimedia players (PMPs), televisions, game machines, wrist-watch type electronic devices, head mount displays, monitors of personal computers, notebook computers, car navigators, car dashboards, digital cameras, camcorders, billboards, medical devices, inspection devices, various home appliances such as refrigerators and washing machines, and internet of thing devices.

Figure 2:
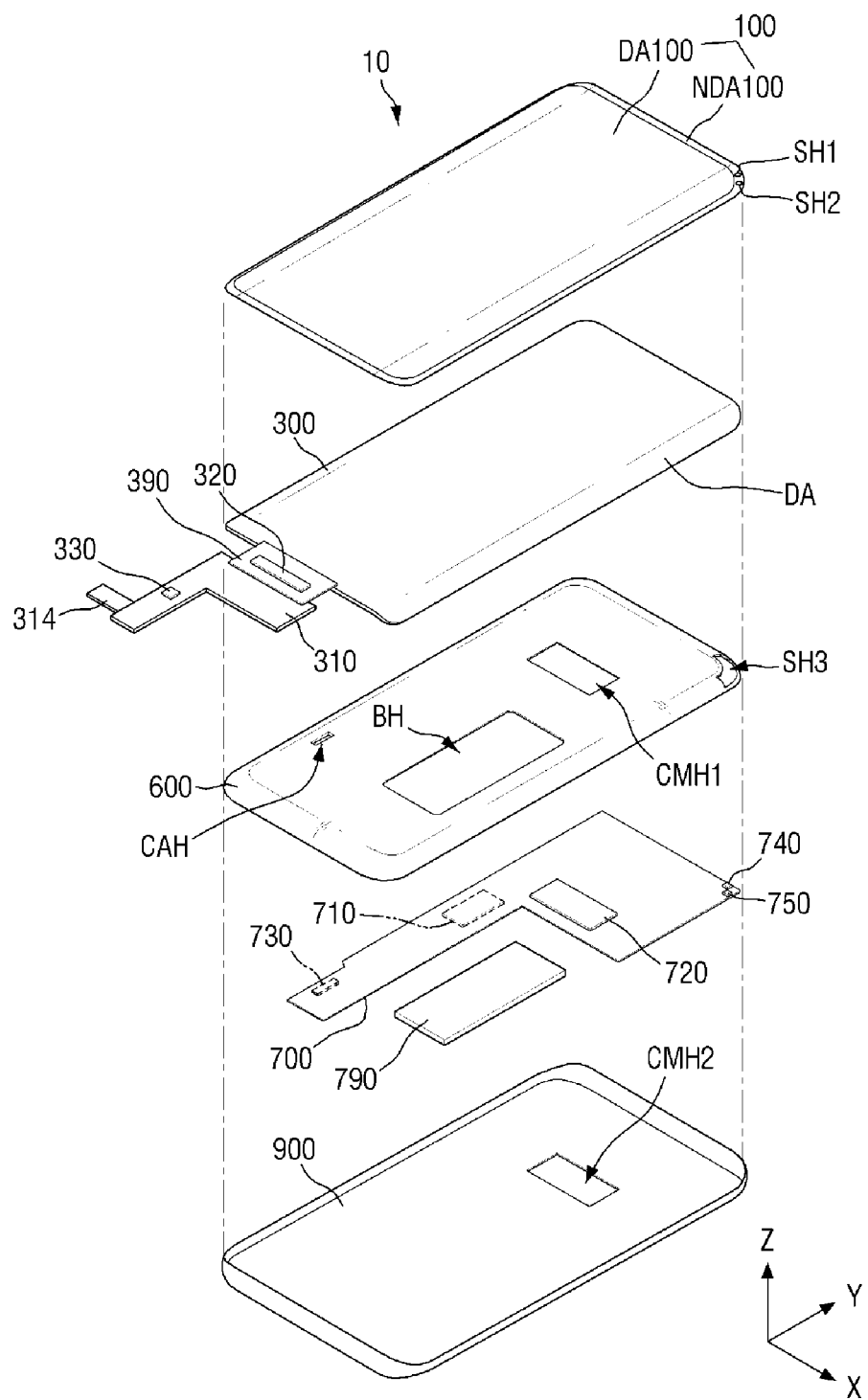
FIG. 2 is an exploded perspective view of a display device according to some example embodiments of the present disclosure.

FIG. 1 is a perspective view of a display device according to some example embodiments of the present disclosure, and FIG. 2 is an exploded perspective view of a display device according to some example embodiments of the present disclosure.

Referring to FIGS. 1 and 2, the display device 10 includes a cover window 100, a display panel 300, a display circuit board 310, a display driving circuit 320, a flexible film 390, a bracket 600, a main circuit board 700, sensor devices 740 and 750, and a lower cover 900.

In this specification, the first direction (X-axis direction) may be a direction parallel to the short side of the display device 10 on a plane, for example, a horizontal direction of the display device 10. The second direction (Y-axis direction) may be a direction parallel to the long side of the display device 10 on a plane, for example, a vertical direction of the display device 10.

The display device 10 may have a rectangular shape in a plan view. For example, as shown in FIGS. 1 and 2, the display device 10 may have a rectangular planar shape having short sides in the first direction (X-axis direction) and long sides in the second direction (Y-axis direction). The corner where the short side in the first direction (X-axis direction) meets the long side in the second direction (Y-axis direction) may be formed to have a round shape (e.g., a semi-circular shape) of a predetermined (or set) curvature or have a right angle shape (e.g., a sharp edge corner). The planar shape of the display device 10 is not limited to a rectangular shape, and may be formed in another polygonal shape, circular shape, or elliptical shape.

The display device 10 may include a first area A1 formed flat (e.g., a first area A1 extending parallel to the first direction (X-axis direction) and the second direction (Y-axis direction)) and a second area A2 extending from the right and left sides of the first area A1 (e.g., a second area A2 extending along the second direction (Y-axis direction) at the edge of the first area A1). The second area A2 may be formed to be flat or curved. When the second area A2 is formed to be flat, the angle formed by the first area A1 and the second area A2 may be an obtuse angle. However, when the second area A2 is formed to be curved, the second area A2 may have a constant curvature or a variable curvature.

Although it is shown in FIG. 1 that the second area A2 extends from the left and right sides of the first area A1, the example embodiments of the present disclosure is not limited thereto. That is, the second area A2 may extend from only one of the left and right sides of the first area A1. In addition, the second area A2 may extend from only one of the upper and lower sides of the first area A1 (e.g., the second area A2 may extend along the first direction (X-axis direction) at the edge of the first area A1) as well as only one of the left and right sides of the first area A1.

The cover window 100 may be disposed on the display panel 300 so as to cover the upper surface of the display panel 300. Thus, the cover window 100 may function to protect the upper surface of the display panel 300.

The cover window 100 may include a light transmitting area DA100 corresponding to the display panel 300 and a light blocking area NDA100 corresponding to an area other than the display panel 300. The light transmitting area DA100 may be formed to be transparent, and the light blocking area NDA100 may be formed to be opaque. Thus, an image displayed by the display panel 300 may be seen through the light transmitting area DA100 of the cover window 100.

The cover window 100 may include through holes SH1 and SH2 penetrating the light blocking area NDA100. The through holes SH1 and SH2 may be disposed at at least one of the corners of the cover window 100. For example, the through holes SH1 and SH2 may be disposed at the corners where the upper short side of the cover window 100 meets the right long side of the cover window 100, as shown in FIG. 2, but the example embodiments of the present disclosure is not limited thereto. For example, one through hole may be disposed at the corner of the cover window 100. Alternatively, one through hole (e.g., SH1 or SH2) may be disposed at one corner of the cover window 100, and the other through hole (e.g., SH1 or SH2) may be disposed at another corner of the cover window 100. Alternatively, a plurality of through holes may be disposed at one corner of the cover window 100, and another plurality of through holes may be disposed at another corner of the cover window 100.

The display panel 300 may be a light emitting display panel including a light emitting element. Examples of the display panel 300 may include an organic light emitting display panel using an organic light emitting diode including an organic light emitting layer, an ultra-micro light emitting diode display panel using an ultra-micro light emitting diode (ultra-micro LED), a quantum dot light emitting diode display panel using a quantum dot light emitting diode including a quantum dot light emitting layer, and an inorganic light emitting display panel using an inorganic light emitting diode including an inorganic semiconductor. Hereinafter, it is assumed that the display panel 300 is an organic light emitting display panel.

The flexible film 390 may be attached to one side of the display panel 300. One side of the flexible film 390 may be attached onto pads provided on one side of the display panel 300 using an anisotropic conductive film. The other side of the flexible film 390 may be attached onto one surface of the display circuit board 310 using an anisotropic conductive film. The flexible film 390 may be a film that can be bent.

Meanwhile, in some example embodiments, the flexible film 390 may be omitted, and the display circuit board 310 may be directly attached to one side of the display panel 300. In this case, one side of the display panel 300 may be bent toward the lower surface of the display panel 300.

The display driving circuit 320 receives control signals and power supply voltages, and generates and outputs signals and voltages for driving the display panel 300. The display driving circuit 320 may be formed as an integrated circuit and may be attached onto the flexible film 390, but the example embodiments of the present disclosure is not limited thereto. For example, the display driving circuit 320 may be attached onto the display panel 300 using a chip on glass (COG) manner, a chip on plastic (COP) manner, or an ultrasonic manner.

The display circuit board 310 may be a flexible printed circuit board, a rigid printed circuit board which is not easily bent, or a composite printed circuit board including both the flexible printed circuit board and the rigid printed circuit board.

A touch driving circuit 330 may be disposed on the display circuit board 310. The touch driving circuit 330 may be formed as an integrated circuit, and attached to the upper surface of the display circuit board 310. The touch driving circuit 330 may be electrically connected to touch electrodes of a touch sensor layer of the display panel 300 through the display circuit board 310. The touch driving circuit 330 may apply touch driving signals to driving electrodes among the touch electrodes, and may sense the charge variations of capacitances between the driving electrodes and the sensing electrodes through the sensing electrodes among the touch electrodes, thereby outputting touch data including user's touch coordinates. A power supply unit may be additionally disposed on the display circuit board 310 to supply display driving voltages for driving the display panel 300 and the display driving circuit 320.

The bracket 600 may be disposed under the display panel 300. The bracket 600 may include plastic, metal, or both plastic and metal. The bracket 600 may be provided with a first camera hole CMH1 into which a first camera sensor 720 is inserted, a battery hole BH in which a battery 790 is disposed, a cable hole CAH through which a cable 314 connected to the display circuit board 310 passes, and a sensor hole SH3 in which the sensor devices 740 and 750 are disposed. Alternatively, the bracket 600 does not include the sensor hole SH3, but may be formed so as not to overlap the sensor devices 740 and 750 in the third direction (Z-axis direction).

The main circuit board 700 and a battery 790 may be disposed under the bracket 600. The main circuit board 700 may be a printed circuit board or a flexible printed circuit board.

The main circuit board 700 may include a main processor 710, a first camera sensor 720, a main connector 730, and sensor devices 740 and 750. The first camera sensor 720 may be disposed on both the upper surface and lower surface of the main circuit board 700, the main processor 710 may be disposed on the upper surface of the main circuit board 700, and the main connector 730 may be disposed on the lower surface of the main circuit board 700. The sensor devices 740 and 750 may be disposed on the upper surface of the main circuit board 700.

The main processor 710 may control all the functions of the display device 10. For example, the main processor 710 may output digital video data to the display driving circuit 320 through the display circuit board 310 such that the display panel 300 displays an image. Further, the main processor 710 may receive touch data from the touch driving circuit 330, determine the touch position of a user, and then execute an application indicated by an icon displayed at the touch position of the user. Further, the main processor 710 may receive touch data from the touch driving unit 220, and may execute an application indicated by an icon displayed at the touch coordinate of the user according to the touch data.

The main processor 710 may control the display device 10 according to sensor signals input from the sensor devices 740 and 750. The sensor devices 740 and 750 may be sensors for sensing light, and examples thereof may include, but are not limited to, a proximity sensor, a luminance sensor, an iris recognition sensor, and a second camera sensor.

The proximity sensor is a sensor for detecting whether an object is located near the upper surface of the display device 10. The proximity sensor may include a light source outputting light and a light receiver receiving light reflected by the object. The proximity sensor may determine whether an object located near the upper surface of the display device 10 exists according to (or based on) the amount of light reflected by the object. Because the proximity sensor overlaps any one of the through holes SH1 and SH2 of the cover window 100 and the sensor hole SH3 of the bracket 600 in the third direction (Z-axis direction), the proximity sensor may generate a proximity sensor signal and output the generated proximity sensor signal to the main processor 710 according to whether an object located near the upper surface of the display device 10 exists.

The luminance sensor is a sensor for sensing the luminance of the upper surface of the display device. The luminance sensor may include a resistor whose resistance value changes according to the luminance of incident light. The luminance sensor may determine the luminance of the upper surface of the display device according to the resistance value of the resistor. Because the luminance sensor overlaps any one of the through holes SH1 and SH2 of the cover window 100 and the sensor hole SH3 of the bracket 600 in the third direction (Z-axis direction), the luminance sensor may generate a luminance sensor signal and output the generated luminance sensor signal to the main processor 710 according to the luminance of the upper surface of the display device 10.

The iris recognition sensor is a sensor for detecting whether a user's iris image is identical to an iris image previously stored in a memory. The iris recognition sensor may generate an iris recognition sensor signal and output the generated iris recognition sensor signal to the main processor 710 according to whether the user's iris image is identical to the iris image previously stored in the memory. Because the iris recognition sensor overlaps any one of the through holes SH1 and SH2 of the cover window 100 and the sensor hole SH3 of the bracket 600 in the third direction (Z-axis direction), the iris recognition sensor may capture the user's iris disposed over the display device 10.

The second camera sensor processes an image frame such as a still image or a moving image obtained by an image sensor, and outputs the image frame to the main processor 710. The second camera sensor may be a CMOS image sensor or a CCD sensor. The number of pixels in the second camera sensor may be smaller than the number of pixels in the first camera sensor 720, and the size of the second camera sensor may be smaller than the size of the first camera sensor 720. Because the second camera sensor overlaps any one of the through holes SH1 and SH2 of the cover window 100 and the sensor hole SH3 of the bracket 600 in the third direction (Z-axis direction), the second camera sensor may capture an object or a background disposed over the display device 10.

When any one of the sensor devices 740 and 750 is a proximity sensor, the main processor 710 may determine whether an object is located near the upper surface of the display device 10 according to the proximity sensor signal input from the proximity sensor. When an object is located near the upper surface of the display device 10 in a call mode in which the user talks to the other party using the display device 10, the main processor 710 may not execute an application indicated by an icon displayed in touch coordinates even when a touch is executed by the user.

When any one of the sensor devices 740 and 750 is a luminance sensor, the main processor 710 may determine the luminance of the upper surface of the display device 10 according to the luminance sensor signal input from the luminance sensor. The main processor 710 may adjust the luminance of an image displayed by the display panel 300 according to the luminance of the upper surface of the display device 10.

When any one of the sensor devices 740 and 750 is an iris recognition sensor, the main processor 710 may determine whether the user's iris image is identical to the iris image previously stored in the memory according to the iris recognition sensor signal input from the iris recognition sensor. When the user's iris image is identical to the iris image previously stored in the memory, the main processor 710 may unlock the display device 10, and may display a home screen on the display panel 300.

When any one of the sensor devices 740 and 750 is a second camera sensor, the main processor 710 may determine whether the user's iris image is identical to the iris image previously stored in the memory according to the iris recognition sensor signal input from the iris recognition sensor. When the user's iris image is identical to the iris image previously stored in the memory, the main processor 710 may unlock the display device 10, and may display a home screen on the display panel 300.

The first camera sensor 720 processes an image frame such as a still image or a moving image obtained by an image sensor, and outputs the image frame to the main processor 710. The first camera sensor 720 may be a CMOS image sensor or a CCD sensor. Because, the first camera sensor 720 may be exposed through the lower surface of the lower cover 900 by the second camera hole CMH2, the first camera sensor 720 may capture an object or a background disposed under the display device 10 (e.g., the first camera sensor 720 may capture an object or a background in an area surrounding the display device 10).

The cable 314 having passed through the cable hole CAH of the bracket 600 may be connected to the main connector 730. Thus, the main circuit board 700 may be electrically connected to the display circuit board 310.

The battery 790 may be disposed not to overlap the main circuit board 700 in the third direction (Z-axis direction). The battery 790 may overlap the battery hole BH of the bracket 600.

In addition, the main circuit board 700 may be further provided with a mobile communication module capable of transmitting and receiving a radio signal to/from at least one of a base station, an external terminal, and a server. The radio signal may include various types of data depending on a voice signal, a video call signal, or a text/multimedia message transmission/reception.

The lower cover 900 may be disposed under the main circuit board 700 and the battery 790. The lower cover 900 may be engaged and fixed to the bracket 600. The lower cover 900 may form a lower surface appearance of the display device 10. The lower cover 900 may include (or may be made of) plastic and/or metal.

The lower cover 900 may be provided with a second camera hole CMH2 through which the lower surface of the first camera sensor 720 is exposed to an environment surrounding the display device 10. The position of the first camera sensor 720 and the positions of the first and second camera holes CMH1 and CMH2 corresponding to the first camera sensor 720 may not be limited to the example embodiment shown in FIG. 2.

As shown in FIGS. 1 and 2, the first sensor device 740 may overlap the first through hole SH1 of the cover window 100 and the sensor hole SH3 of the bracket 600 in the third direction (Z-axis direction), and the second sensor device 750 may overlap the second through hole SH2 of the cover window 100 and the sensor hole SH3 of the bracket 600 in the third direction (Z-axis direction). Thus, each of the first sensor device 740 and the second sensor device 750 may detect light incident from the upper surface of the display device 10.

Figure 3:
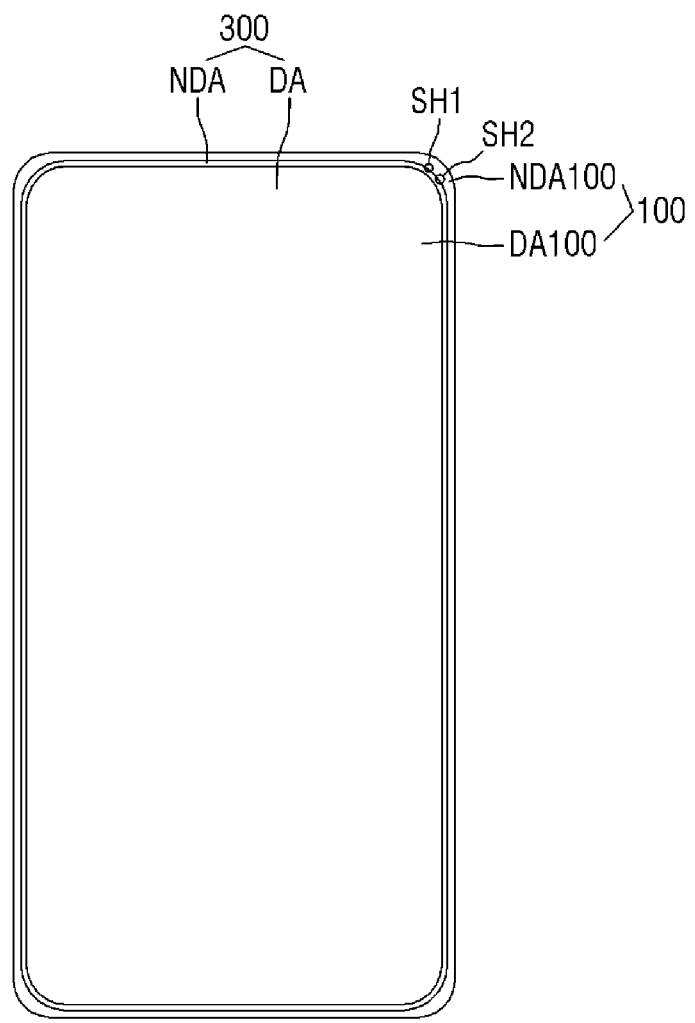
FIG. 3 is a plan view showing a display panel and a cover window according to some example embodiments of the present disclosure.
Figure 4:
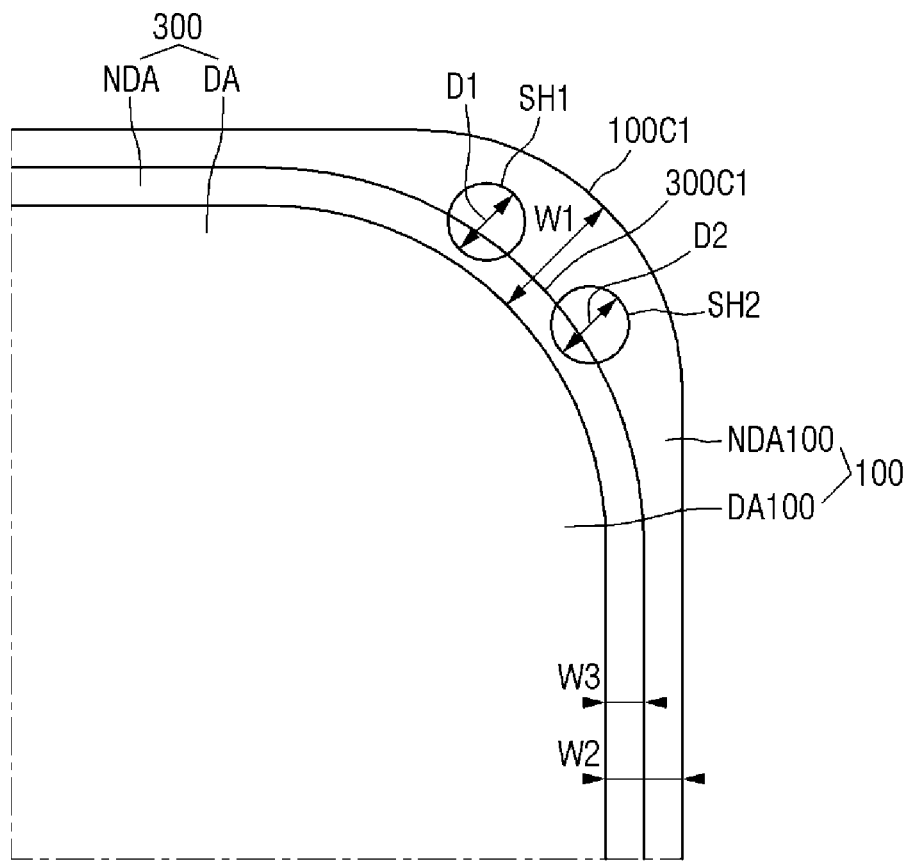
FIG. 4 is a plan view specifically showing a first corner of the display panel and cover window of FIG. 3, according to some example embodiments of the present disclosure.

FIG. 3 is a plan view showing a display panel and a cover window according to some example embodiments of the present disclosure, and FIG. 4 is a plan view specifically showing a first corner of the display panel and cover window of FIG. 3.

Referring to FIGS. 3 and 4, the cover window 100 may include a light transmitting area DA100 that transmits light and a light blocking area NDA100 that blocks light. The light blocking area NDA100 may be disposed at an edge of the cover window 100. The light blocking area NDA100 may be disposed to surround the light transmitting area DA100.

The curvature of the first corner 100C1 of the cover window 100 may be smaller than the curvature of the first corner 300C1 of the display panel 300. Thus, the maximum width W1 of the light blocking area NDA100 at the first corner 100C1 of the cover window 100 may be wider than the maximum width W2 of the light blocking area NDA100 at one side of the cover window 100. The diameter D1 of the first through hole SH1 and the diameter D2 of the second through hole SH2 may be smaller than the maximum width W1 of the light blocking area NDA100 at the first corner 100C1 of the cover window 100.

Because, the curvature of the first corner 100C1 of the cover window 100 may be smaller than the curvature of the first corner 300C1 of the display panel 300, the maximum width W1 of the light blocking area NDA100 at the first corner 100C1 of the cover window 100 may be designed sufficiently wide. Therefore, even when the first through hole SH1 and the second through hole SH2 are disposed in the light blocking area NDA100 at the first corner 100C1 of the cover window 100, the size of the first through hole SH1 is sufficient for the first sensor device 740 to be disposed, and the size of the second through hole SH2 may be sufficient for the second sensor device 750 to be disposed.

The cover window 100 may include a first through hole SH1 and a second through hole SH2 that penetrate through the light blocking area NDA. A part of the first through hole SH1 and a part of the second through hole SH2 may overlap the non-display area NDA of the display panel 300 in the third direction (Z-axis direction). In order to increase the transmittance of the first through hole SH1, the area of the first through hole SH1 overlapping the non-display area NDA of the display panel 300 may be smaller than the area of the first through hole SH1 not overlapping the non-display area NDA of the display panel 300. In order to increase the transmittance of the second through hole SH2, the area of the second through hole SH2 overlapping the non-display area NDA of the display panel 300 may be smaller than the area of the second through hole SH2 not overlapping the non-display area NDA of the display panel 300.

The display panel 300 may include a display area DA in which pixels are formed to display an image, and a non-display area NDA in which an image is not displayed. The display area DA of the display panel 300 may overlap the light transmitting area DA100 of the cover window 100 in the third direction (Z-axis direction). The non-display area NDA of the display panel 300 may overlap the light blocking area NDA100 of the cover window 100 in the third direction (Z-axis direction). The width W3 of the non-display area NDA of the display panel 300 may be smaller than the width W1/W2 of the light blocking area NDA100 of the cover window 100.

As shown in FIGS. 3 and 4, the first through hole SH1 and the second through hole SH2 penetrate through the light blocking area NDA100 of the cover window 100 and overlap the non-display area NDA of the display panel 300. That is, because the first through hole SH1 and the second through hole SH2 are not disposed in the display area DA of the display panel 300, it is possible to prevent (or reduce) the deterioration of aesthetic feelings due to the through holes disposed in the display area DA of the display panel 300. Further, because the through holes are not disposed in the display area DA of the display panel 300, wiring design may be relatively easy. Further, because the sensor devices 740 and 750 do not need to be disposed to overlap the display area DA of the display panel 300 in the third direction (Z-axis direction), it may not be needed to remove pixels from the display area DA of the display panel 300 due to the first and second through holes SH1 and SH2. Therefore, it is possible to prevent (or reduce the chance of) the resolution of the display area DA of the display panel 300 from being lowered.

Figure 5:
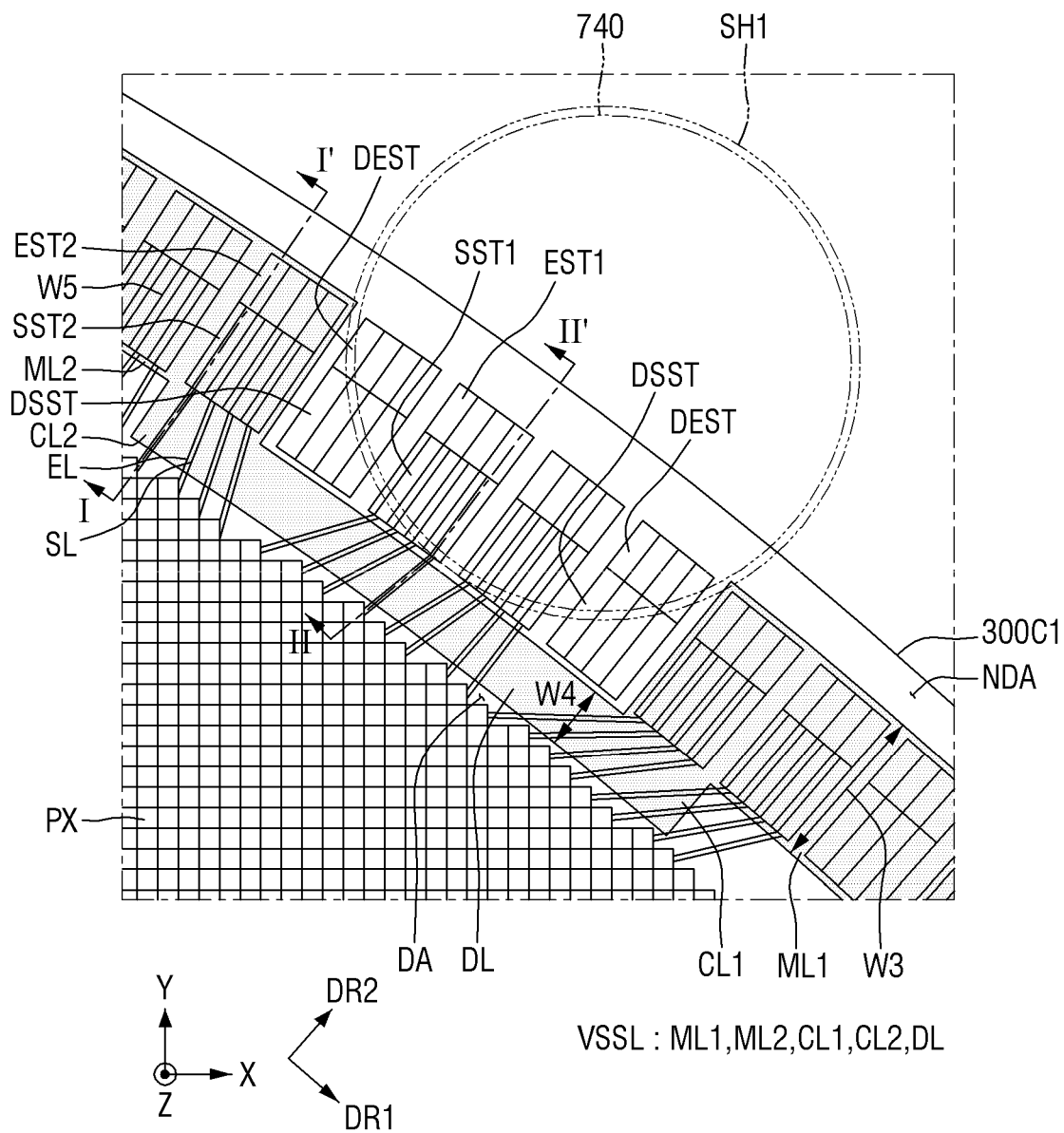
FIG. 5 is a plan view showing an example of a first corner of a display panel, overlapping a first through hole, according to some example embodiments of the present disclosure.

FIG. 5 is a plan view showing a first corner and a first through hole of a display panel.

Referring to FIG. 5, in the display area DA of the display panel 300, pixels PX may be arranged in parallel (and/or in series) to each other in the first direction (X-axis direction) and the second direction (Y-axis direction). In the display area DA of the display panel 300, scan lines SL and light emission lines EL may be arranged in the first direction (X-axis direction). The scan lines SL and the light emission lines EL may be arranged in parallel with each other. The scan lines SL and the light emission lines EL may overlap the pixels PX. For example, one scan line SL and one light emission line EL may overlap the pixels PX arranged in the first direction (X-axis direction).

Data lines extending in the second direction (Y-axis direction) may be disposed in the display area DA. The data lines may cross the scan lines SL and the light emission lines EL. The data lines may overlap the pixels PX. For example, one data line may overlap the pixels PX arranged in the second direction (Y-axis direction). In FIG. 5, the data line is omitted for convenience of description.

Each of the pixels PX may be connected to at least one of the scan lines SL (e.g., SLk−1, SLk and SLk+1), at least one of the light emission lines EL (e.g., Ek), and at least one of the data lines (e.g., DLj). For example, as shown in FIG. 6, the pixel PX may be connected to three scan lines SL (e.g., SLk−1, SLk and SLk+1), one light emission line EL (e.g., Ek), and one data line (e.g., DLj).

Figure 6:
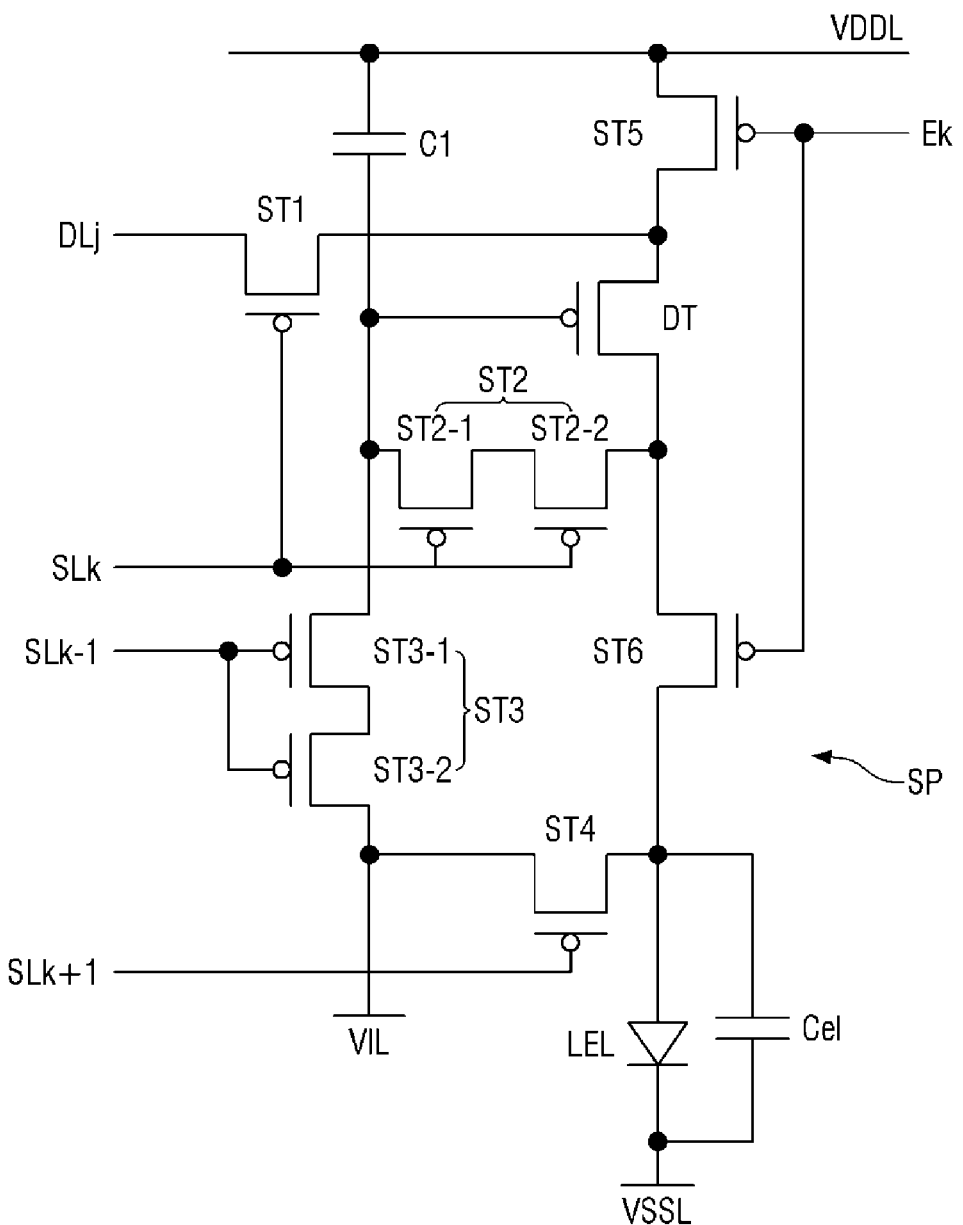
FIG. 6 is a circuit diagram showing an example of the pixel of FIG. 5, according to some example embodiments of the present disclosure.

Specifically, as shown in FIG. 6, the pixel PX (or SP) may include a driving transistor DT, a light emitting element LEL, switch elements, and a capacitor C1. The switch elements may include first to sixth transistors ST1, ST2, ST3, ST4, ST5, and ST6. It is shown in FIG. 6 that the pixel PX (or SP) is connected to a k−1-th (k is a positive integer of 2 or more) scan line SLk−1, a k-th scan line SLk, a k+1-th scan line SLk+1, and a j-th (j is a positive integer) data line DLj.

The driving transistor DT controls a drain-source current Ids (hereinafter referred to as "drive current") according to a data voltage applied to a gate electrode of the driving transistor DT. As shown in Equation 1 below, the driving current Ids flowing through the channel of the driving transistor DT is proportional to square of difference between the gate-source voltage Vsg and a threshold voltage of the driving transistor DT.

$$Ids = k' \times (Vsg - Vth)^2 \quad \text{[Equation 1]}$$

In Equation 1, k' is a proportional coefficient determined by the structure and physical characteristics of the driving transistor DT, Vsg is a gate-source voltage of the driving transistor DT, and Vth is a threshold voltage of the driving transistor DT.

The light emitting element LEL emits light according to the driving current Ids. The amount of light emitted from the light emitting element LEL may be proportional to the driving current Ids.

The light emitting element LEL may be an organic light emitting diode (OLED) including an anode electrode, a cathode electrode, and an organic light emitting layer disposed between the anode electrode and the cathode electrode. Alternatively, the light emitting element LEL may be an inorganic light emitting element including an anode electrode, a cathode electrode, and an inorganic semiconductor disposed between the anode electrode and the cathode electrode. Alternatively, the light emitting element LEL may be a quantum dot light emitting element including an anode electrode, a cathode electrode, and a quantum dot light emitting layer disposed between the anode electrode and the cathode electrode. Alternatively, the light emitting element LEL may be a micro light emitting diode.

The anode electrode of the light emitting element LEL may be connected to the first electrode of the fourth transistor ST4 and the second electrode of the sixth transistor ST6, and the cathode electrode thereof may be connected to a first power supply line VSSL. A parasitic capacitor Cel may be formed between the anode electrode and cathode electrode of the light emitting element LEL.

The first transistor ST1 is turned on by a scan signal of the k-th scan line SLk to connect the first electrode of the driving transistor DT to the j-th data line DLj. The gate electrode of the first transistor ST1 may be connected to the k-th scan line SLk, the first electrode thereof may be connected to the first electrode of the driving transistor DT, and the second electrode thereof may be connected to the data line DLj.

The second transistor ST2 may be formed as a dual transistor including a 2-1 transistor ST2-1 and a 2-2 transistor ST2-2. The 2-1 transistor ST2-1 and the 2-2 transistor ST2-2 are turned on by the scan signal of the k-th scan line SLk to connect the gate electrode of the driving transistor DT to the second electrode thereof. That is, when the 2-1 transistor ST2-1 and the 2-2 transistor ST2-2 are turned on, the gate electrode of the driving transistor DT is connected to the second electrode thereof, and thus the driving transistor DT is driven by a diode (e.g., diode connected). The gate electrode of the 2-1 transistor ST2-1 may be connected to the k-th scan line SLk, the first electrode thereof may be connected to the second electrode of the 2-2 transistor ST2-2, and the second electrode thereof may be connected to the gate electrode of the driving transistor DT. The gate electrode of the 2-2 transistor ST2-2 may be connected to the k-th scan line SLk, the first electrode thereof may be connected to the second electrode of the driving transistor DT, and the second electrode thereof may be connected to the first electrode of the 2-2 transistor ST2-2.

The third transistor ST3 may be formed as a dual transistor including a 3-1 transistor ST3-1 and a 3-2 transistor ST3-2. The 3-1 transistor ST3-1 and the 3-2 transistor ST3-2 are turned on by the scan signal of the k−1-th scan line SLk−1 to connect the gate electrode of the driving transistor DT to an initialization voltage line VIL. The gate electrode of the driving transistor DT may be discharged to an initialization voltage of the initialization voltage line VIL. The gate electrode of the 3-1 transistor ST3-1 may be connected to the k−1-th scan line SLk−1, the first electrode thereof may be connected to the gate electrode of the driving transistor DT, and the second electrode thereof may be connected to the first electrode of the 3-2 transistor ST3-2. The gate electrode of the 3-2 transistor ST3-2 may be connected to the k−1-th scan line SLk−1, the first electrode thereof may be connected to the second electrode of the 3-1 transistor ST3-1, and the second electrode thereof may be connected to the initialization voltage line VIL.

The fourth transistor ST4 is turned on by the scan signal of the k+1-th scan line SLk+1 to connect the anode electrode of the light emitting element LEL to the initialization voltage line VIL. The anode electrode of the light emitting element LEL may be discharged to an initialization voltage of the initialization voltage line VIL. The gate electrode of the fourth transistor ST4 may be connected to the k+1-th scan line SLk+1, the first electrode thereof may be connected to the anode electrode of the light emitting element LEL, and the second electrode thereof may be connected to an initialization voltage line VIL.

The fifth transistor ST5 is turned on by the light emission control signal of a k-th light emission line Ek to connect the first electrode of the driving transistor DT to a second power supply line VDDL. The gate electrode of the fifth transistor ST5 may be connected to the k-th light emission line Ek, the first electrode thereof may be connected to the second power supply line VDDL, and the second electrode thereof may be connected to the source electrode of the driving transistor DT.

The sixth transistor ST6 is connected between the second electrode of the driving transistor DT and the anode electrode of the light emitting element LEL. The sixth transistor ST6 is turned on by the light emission control signal of the k-th light emission line Ek to connect the second electrode of the driving transistor DT to the anode electrode of the light emitting element LEL. The gate electrode of the sixth transistor ST6 is connected to the k-th light emission line Ek, the first electrode thereof is connected to the second electrode of the driving transistor DT, and the second electrode thereof is connected to the anode electrode of the light emitting element LEL. When both the fifth transistor ST5 and the sixth transistor ST6 are turned on, the driving current Ids may be supplied to the light emitting element LEL.

The capacitor C1 is located (e.g., formed) between the gate electrode of the driving transistor DT and the second power supply line VDDL. One electrode of the capacitor C1 may be connected to the gate electrode of the driving transistor DT, and the other electrode thereof may be connected to the second power supply line VDDL.

When the first electrode of each of the first to sixth transistors ST1, ST2, ST3, ST4, ST5, ST6, and the driving transistor DT is a source electrode, the second electrode thereof may be a drain electrode. Alternatively, when the first electrode of each of the first to sixth transistors ST1, ST2, ST3, ST4, ST5, ST6, and the driving transistor DT is a drain electrode, the second electrode thereof may be a source electrode.

The active layer of each of the first to sixth transistors ST1, ST2, ST3, ST4, ST5, ST6, and the driving transistor DT may be formed of any one of poly silicon, amorphous silicon, and an oxide semiconductor. When the active layer of each of the first to sixth transistors ST1, ST2, ST3, ST4, ST5, ST6, and the driving transistor DT is formed of poly silicon, the process of forming the active layer may be a low-temperature poly silicon (PTPS) process.

The non-display area NDA of the display panel 300 may be provided with scan stages SST1 and SST2 of a scan driver SDU connected to the scan lines SL, light emitting stages EST1 and EST2 of a light emission driver EDU, dummy scan stages DSST, dummy light emitting stages DEST, and a first power supply line VSSL.

The scan driver SDU may include first scan stages SST1 and second scan stages SST2. Each of the first scan stages SST1 may overlap the first through hole SH1 and the first sensor device 740 in the third direction (Z-axis direction). Each of the second scan stages SST2 may not overlap the first through hole SH1 and the first sensor device 740 in the third direction (Z-axis direction).

The first scan stages SST1 and the second scan stages SST2 may be arranged in one direction DR1 along the curvature of the first corner 300C1. The length (width) of each of the first scan stages SST1 in one direction DR1 may be shorter than the length thereof in the other direction DR2 crossing the one direction DR1. The length (width) of each of the second scan stages SST2 in one direction DR1 may be shorter than the length thereof in the other direction DR2.

Each of the first scan stages SST1 and the second scan stages SST2 may be connected to the scan lines SL. The scan lines SL may be bent at least once. Each of the first scan stages SST1 and the second scan stages SST2 may be connected to scan control lines to which scan control signals are applied. The scan control lines may extend in one direction DR1. Each of the first scan stages SST1 and the second scan stages SST2 may generate a scan signal according to the scan control signals, and output the scan signal to the scan line SL.

The light emission driver EDU may include first light emission stages EST1 and second light emission stages EST2. Each of the first light emission stages EST1 may overlap the first through hole SH1 and the first sensor device 740 in the third direction (Z-axis direction). Each of the second light emission stages EST2 may not overlap the first through hole SH1 and the first sensor device 740 in the third direction (Z-axis direction).

The first light emission stages EST1 and the second light emission stages EST2 may be arranged in one direction DR1 along the curvature of the first corner 300C1. The length (width) of each of the first light emission stages EST1 in one direction DR1 may be shorter than the length thereof in the other direction DR2. The length (width) of each of the second light emission stages EST2 in one direction DR1 may be shorter than the length thereof in the other direction DR2.

Each of the first light emission stages EST1 and the second light emission stages EST2 may be connected to the light emission lines EL. Each of the first light emission stages EST1 and the second light emission stages EST2 may be connected to light emission control lines to which light emission control signals are applied. The light emission control lines may extend in one direction DR1. Each of the first light emission stages EST1 and the second light emission stages EST2 may generate a light emission signal according to the light emission control signals, and output the light emission signal to the light emission line EL.

The light emission line EL connected to the first light emission stage EST1 may overlap the first scan stage SST1 in the third direction (Z-axis direction). The light emission line EL connected to the second light emission stage EST2 may overlap the second scan stage SST2 in the third direction (Z-axis direction). Each of the light emission lines EL may be bent at least once.

The first light emission stages EST1 may be disposed closer to the edge of the first corner 300C1 of the display panel 300 in the other direction DR2 than the first scan stages SST1. The second light emission stages EST2 may be disposed closer to the edge of the first corner 300C1 of the display panel 300 in the other direction DR2 than the second scan stages SST2.

The dummy scan stages DSST may be disposed between the first scan stage SST1 and the second scan stage SST2 which are adjacent to each other in one direction DR1, but the present disclosure is not limited thereto. For example, the dummy scan stages DSST may be disposed between the first scan stages SST1 adjacent to each other in one direction DR1 or between the second scan stages SST2 adjacent to each other in one direction DR1. A dummy scan stage DSST of at least some of the dummy scan stages DSST may overlap the first through hole SH1 and the first sensor device 740 in the third direction (Z-axis direction). The dummy scan stages DSST may be disposed in one direction DR1 along the curvature of the first corner 300C1. The length of each of the dummy scan stages DSST in one direction DR1 may be shorter than the length thereof in the other direction DR2. Each of the dummy scan stages DSST is not connected to the scan line SL. That is, the dummy scan stages DSST do not generate a scan signal and output the scan signal to the scan line SL.

Although it is shown in FIG. 5 that the dummy scan stages DSST are disposed between the first scan stage SST1 and the second scan stage SST2 which are adjacent to each other in one direction DR1, the present disclosure is not limited thereto. For example, the dummy light emission stages DEST may be disposed between the first light emission stages EST1 adjacent to each other in one direction DR1 or between the second light emission stages EST2 adjacent to each other in one direction DR1. A dummy light emission stages DEST of at least some of the dummy light emission stages DEST may overlap the first through hole SH1 and the first sensor device 740 in the third direction (Z-axis direction). The dummy light emission stages DEST may be disposed in one direction DR1 along the curvature of the first corner 300C1. The length of each of the dummy light emission stages DEST in one direction DR1 may be shorter than the length thereof in the other direction DR2. Each of the dummy light emission stages DEST is not connected to the light emission line EL. That is, the dummy light emission stages DEST do not generate a light emission signal and output the light emission signal to the light emission line EL.

Meanwhile, when the first corner 300C1 is roundly formed (e.g., substantially curved) to have a predetermined (or set) curvature as shown in FIG. 5, a space (an extra space) may remain between the scan stages SST1 and SST2. When the dummy scan stages DSST are not disposed in the space (this extra space), the active layers, gate electrodes, source electrodes, and drain electrodes of some transistors of the first scan stage SST1 and the second scan stage SST2 adjacent to the space may be over-etched. Thus, the driving of the first scan stage SST1 and the second scan stage SST2 adjacent to the space may be influenced (e.g., adversely influenced). For example, there may be a difference between a scan signal of each of the first scan stage SST1 and the second scan stage SST2 adjacent to the space and a scan signal of each (a corresponding one) of other first scan stages SST1 and other second scan stages SST2 (the other first scan stages SST1 and the other second scan stages SST2 being the scan stages not adjacent to the space). Therefore, as shown in FIG. 5, the dummy scan stages DSST are disposed in the space, thereby preventing (or protecting) the active layers, gate electrodes, source electrodes, and drain electrodes of some transistors of the first scan stage SST1 and the second scan stage SST2 adjacent to the space from being over-etched.

Further, when the first corner 300C1 is roundly formed (e.g., substantially curved) to have a predetermined (or set) curvature as shown in FIG. 5, a space may remain between the light emission stages EST1 and EST2. When the dummy light emission stages DEST are not disposed in the space, the active layers, gate electrodes, source electrodes, and drain electrodes of some transistors of the first light emission stage EST1 and the second light emission stage EST2 adjacent to the space may be over-etched. Therefore, as shown in FIG. 5, the dummy light emission stages DEST are disposed in the space, thereby preventing (or protecting) the active layers, gate electrodes, source electrodes, and drain electrodes of some transistors of the first light emission stage EST1 and the second light emission stage EST2 adjacent to the space from being over-etched.

When the first power supply line VSSL overlaps the first through hole SH1 and the first sensor device 740 in the third direction (Z-axis direction), a part of the upper portion of the first sensor device 740 disposed in the first through hole SH1 may be covered. Therefore, in order to increase the transmittance of light incident on the first sensor device 740 through the first through hole SH1, as shown in FIG. 5, the first power supply line VSSL may not overlap the first through hole SH1 and the first sensor device 740 in the third direction (Z-axis direction). Therefore, the first power supply line VSSL may overlap the second scan stages SST2 in the third direction (Z-axis direction), and may not overlap the first scan stages SST1 in the third direction (Z-axis direction). Further, the first power supply line VSSL may not overlap the dummy scan stages DSST of at least some of the dummy scan stages DSST and the dummy light emission stages DEST of at least some of the dummy light emission stages DEST in the third direction (Z-axis direction).

The first power supply line VSSL may be bent at least twice so as not to overlap the first through hole SH1 and the first sensor device 740. For example, as shown in FIG. 5, the first power supply line VSSL may include a first main line ML1, a second main line ML2, a bypass line DL, a first bending line CL1, and a second bending line CL2.

Each of the first main line ML1 and the second main line ML2 may extend in one direction DR1, and may overlap the second scan stages SST2 and the second light emission stages EST2 in the third direction (Z-axis direction). The first main line ML1 may be disposed at one side of the first through hole SH1 in a plan view, and the second main line ML2 may be disposed at the other side opposite to one side of the first through hole SH1 in the plan view.

The bypass line DL may extend in one direction DR1. The bypass line DL may be disposed between the pixel PX and the first scan stage SST1 and between the pixel PX and the dummy scan stage DSST in the other direction DR2.

Meanwhile, the distance between the pixel PX and the first scan stage SST1 and the distance between the pixel PX and the dummy scan stage DSST are shorter than the lengths of the second scan stages SST2 and the second light emission stages EST2 in the other direction DR2. Therefore, the width W4 of the bypass line DL may be shorter than the width W3 of the first main line ML1, and may be shorter than the width W5 of the second main line ML2. The width W4 of the bypass line DL is the length of the bypass line DL in the other direction DR2, the width W3 of the first main line ML1 is the length of the first main line ML1 in the other direction DR2, and the width W5 of the second main line ML2 is the length of the second main line ML2 in the other direction DR2.

The first bending line CL1 may be a line protruding from the first main line ML1 in the other direction DR2 in order to connect the first main line ML1 to one end of the bypass line DL. The first bending line CL1 may protrude from the first main line ML1 in a direction toward the display area DA.

The second bending line CL2 may be a line protruding from the second main line ML2 in the other direction DR2 in order to connect the second main line ML2 to the other end of the bypass line DL. The second bending line CL2 may protrude from the second main line ML2 in a direction toward the display area DA.

As shown in FIG. 5, the first power supply line VSSL may not overlap the first through hole SH1 and the first sensor device 740 in the third direction (Z-axis direction). Therefore, when the first through hole SH1 and the first sensor device 740 overlap the non-display area NDA of the display panel 300, light incident through the first through hole SH1 may be prevented from being blocked by the first power line VSSL (or chances of the light incident through the first through hole SH1 from being blocked by the first power line VSSL may be reduced). Therefore, the transmittance of light incident on the first sensor device 740 through the first through hole SH1 may be increased.

Meanwhile, because the first corner 300C1 of the display panel 300 overlapping the second through hole SH2 is substantially the same as that described with reference to FIG. 5, a description thereof will be omitted, as one of the ordinary skill in the art would be able to describe from the detailed description of FIG. 5.

Figure 7:
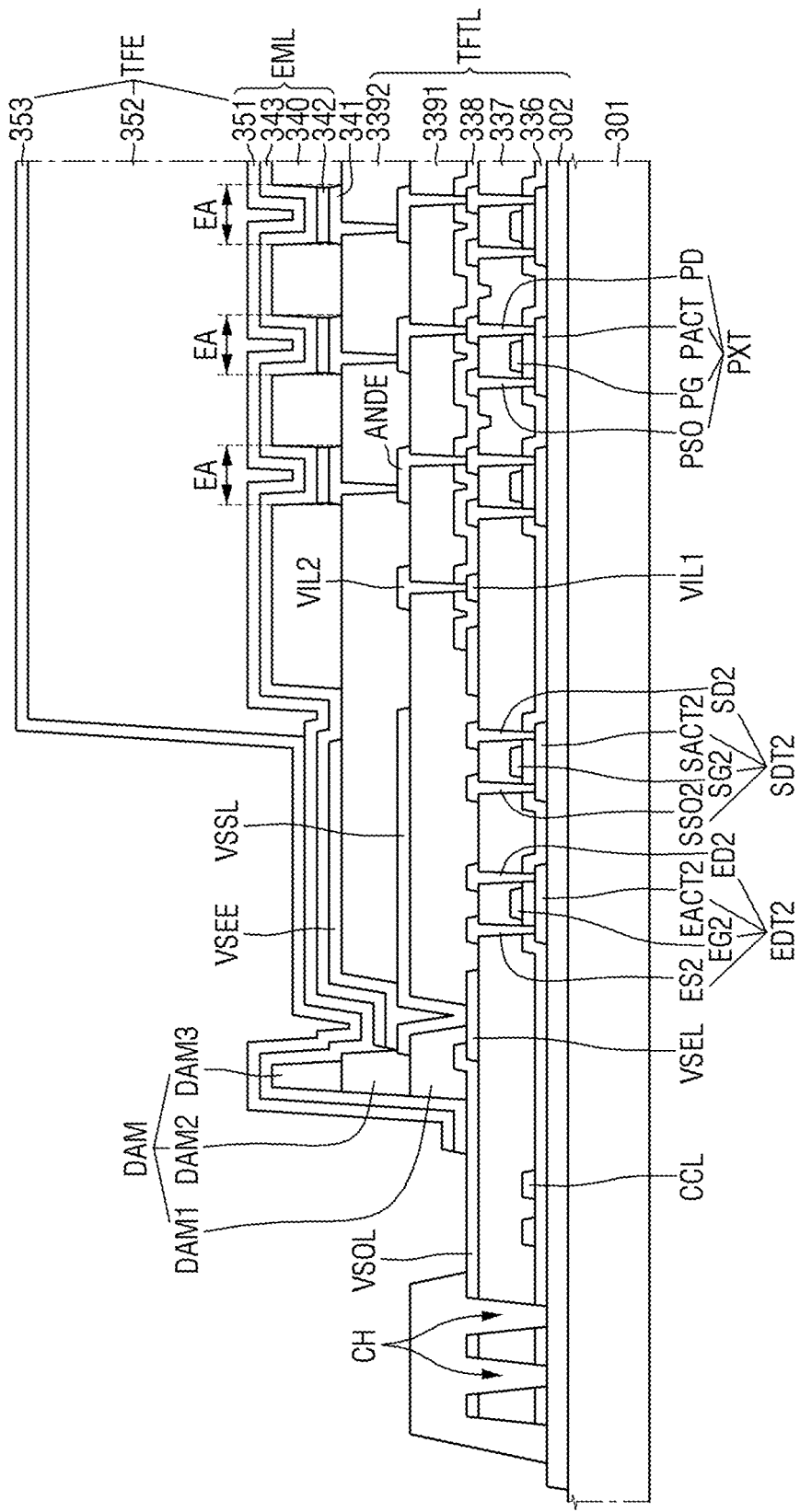
FIG. 7 is an example showing a cross-sectional view across I-I' of FIG. 5, according to some example embodiments of the present disclosure.
Figure 8:
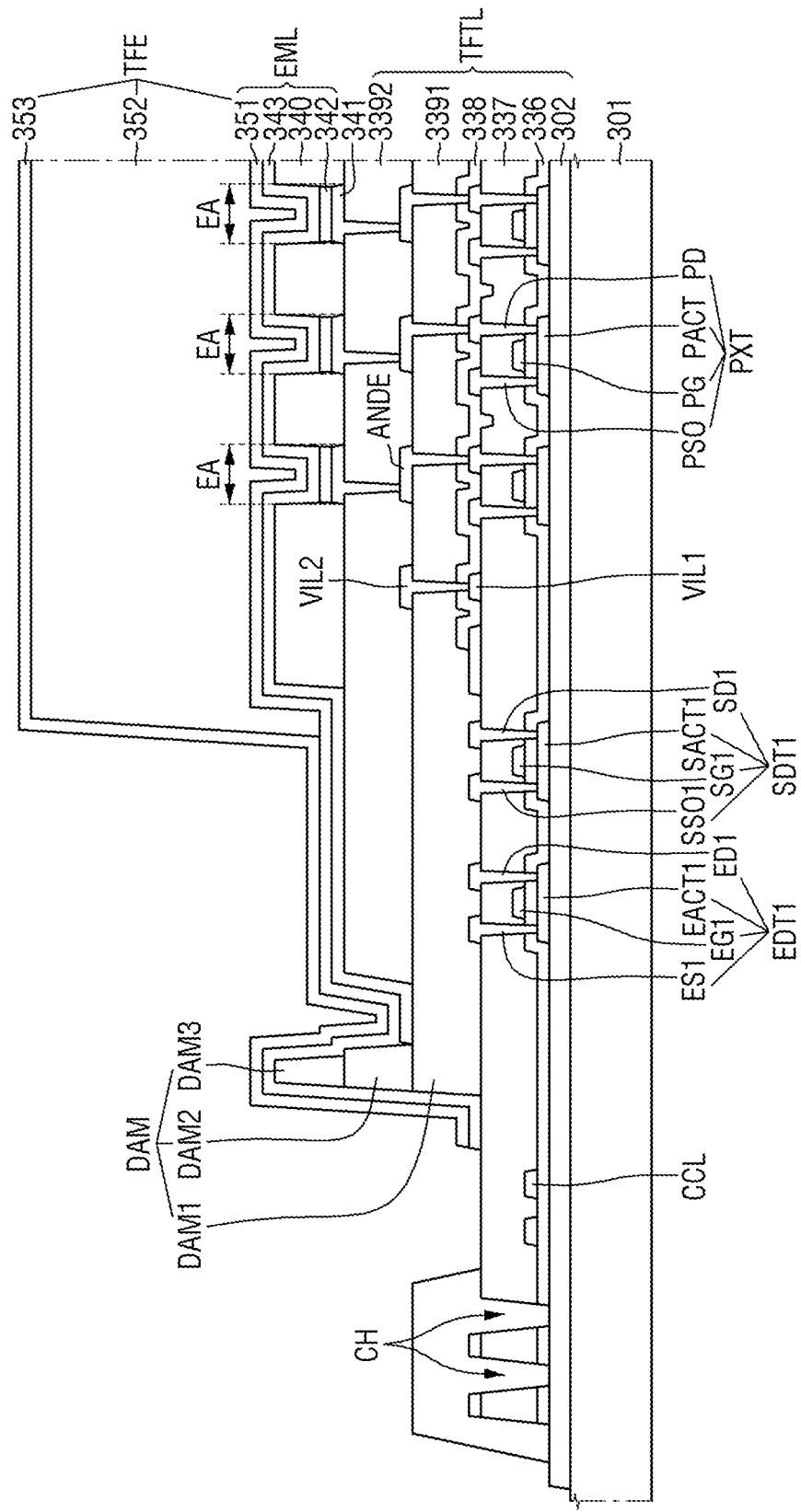
FIG. 8 is an example showing a cross-sectional view across II-II' of FIG. 5, according to some example embodiments of the present disclosure.

FIG. 7 is an example showing a cross-sectional view across I-I' of FIG. 5, and FIG. 8 is an example showing a cross-sectional view across II-II' of FIG. 5.

FIG. 7 shows a pixel transistor PXT of the pixels PX in the display area DA, a second scan driving transistor SDT2 of the second scan stage SST2 in the non-display area NDA not overlapping the first through hole SH1, and a second light emission driving transistor EDT2 of the second light emission stage EST2. FIG. 8 shows a pixel transistor PXT of the pixels PX in the display area DA, a first scan driving transistor SDT1 of the first scan stage SST1 in the non-display area NDA not overlapping the first through hole SH1, and a first light emission driving transistor EDT1 of the first light emission stage EST1.

Referring to FIGS. 7 and 8, a thin film transistor layer TFTL, a light emitting element layer EML, and an encapsulation film TFE are sequentially located (e.g., formed) on a substrate 301.

The substrate 301 may be made of an insulating material such as glass, quartz, or a polymer resin. The substrate 301 may be a rigid substrate or a flexible substrate capable of bending, folding, rolling, or the like.

The thin film transistor layer TFTL includes a buffer film 302, an active layer, a gate insulating film 336, a gate metal layer, an interlayer insulating film 337, a first source-drain metal layer, a protective film 338, and a first organic film 3391, a second source-drain metal layer, and a second organic film 3392. Further, the thin film transistor layer TFTL may include pixel transistors PXT, a first scan driving transistor SDT1, a second scan driving transistor SDT2, a first light emission driving transistor EDT1, and a second light emission driving transistor EDT2. Here, the pixel transistors PXT may be the sixth transistors ST6 of FIG. 6.

The buffer film 302 may be located (e.g., formed) on one surface of the substrate 301. The buffer film 302 may be located (e.g., formed) on the substrate 301 so as to protect thin film transistors and light emitting elements from moisture penetrating through the substrate 301 which is vulnerable to moisture. The buffer film 302 may be formed of a plurality of alternately laminated inorganic films. For example, the buffer film 302 may be formed as a multi-layer film in which one or more inorganic layers including one or more of a silicon oxide (SiOx), a silicon nitride (SiNx), and SiON are alternately laminated. In some embodiments, the buffer film 302 may be omitted.

The pixel transistors PXT, the first scan driving transistor SDT1, the second scan driving transistor SDT2, the first light emission driving transistor EDT1, and the second light emission driving transistor EDT2 may be located (e.g., formed) on the buffer film 302. The pixel transistors PXT may be disposed in the display area DA. The first scan driving transistor SDT1, the second scan driving transistor SDT2, the first light emission driving transistor EDT1, and the second light emission driving transistor EDT2 may be disposed in the non-display area NDA.

Each of the pixel transistors PXT may include a pixel active layer PACT, a pixel gate electrode PG, a pixel source electrode PSO, and a pixel drain electrode PD. The first scan driving transistor SDT1 may include a first scan active layer SACT1, a first scan gate electrode SG1, a first scan source electrode SSO1, and a first scan drain electrode SD1. The second scan driving transistor SDT2 may include a second scan active layer SACT2, a second scan gate electrode SG2, a second scan source electrode SSO2, and a second scan drain electrode SD2. The first light emission driving transistor EDT1 may include a first light emission active layer EACT1, a first light emission gate electrode EG1, a first light emission source electrode ES1, and a first light emission drain electrode ED1. The second light emission driving transistor EDT2 may include a second light emission active layer EACT2, a second light emission gate electrode EG2, a second light emission source electrode ES2, and a second light emission drain electrode ED2.

Although it is illustrated in FIGS. 7 and 8 that the pixel transistors PXT, the first scan driving transistor SDT1, the second scan driving transistor SDT2, the first light emission driving transistor EDT1, and the second light emission driving transistor EDT2 are respectively formed in a top gate manner, the present disclosure is not limited thereto. That is, the pixel transistors PXT, the first scan driving transistor SDT1, the second scan driving transistor SDT2, the first light emission driving transistor EDT1, and the second light emission driving transistor EDT2 may be respectively formed in a bottom gate manner or a double gate manner.

The pixel active layers PACT, the first scan active layer SACT1, the second scan active layer SACT2, the first light emission active layer EACT1, and the second light emission active layer EACT2 may be located (e.g., formed) on the buffer film 302. The pixel active layers PACT, the first scan active layer SACT1, the second scan active layer SACT2, the first light emission active layer EACT1, and the second light emission active layer EACT2 may be formed of a silicon-based semiconductor material or an oxide-based semiconductor material. A light blocking layer for blocking external light may be located (e.g., formed) between the buffer film 302 and each of the pixel active layers PACT, the first scan active layer SACT1, the second scan active layer SACT2, the first light emission active layer EACT1, and the second light emission active layer EACT2.

The gate insulating film 336 may be located (e.g., formed) on the pixel active layers PACT, the first scan active layer SACT1, the second scan active layer SACT2, the first light emission active layer EACT1, and the second light emission active layer EACT2. The gate insulating film 336 may be formed of an inorganic film, for example, a silicon oxide (SiOx) film, a silicon nitride (SiNx) film, or a multi-layer film thereof.

A gate metal layer including a pixel gate electrode PG, a first scan gate electrode SG1, a second scan gate electrode SG2, a first light emission gate electrode EG1, a second light emission gate electrode EG2, and scan lines SL may be located (e.g., formed) on the gate insulating film 336. The gate metal layer may be formed as a single layer (or as a multi-layer structure) including at least one of molybdenum (Mo), aluminum (Al), chromium (Cr), gold (Au), titanium (Ti), nickel (Ni), neodymium (Nd) and copper (Cu), or an alloy thereof.

The interlayer insulating film 337 may be located (e.g., formed) on the gate metal layer. The interlayer insulating film 337 may be formed of an inorganic film, for example, a silicon oxide (SiOx) film, a silicon nitride (SiNx) film, or a multi-layer film thereof.

The first source-drain metal layer including a pixel source electrode PSO, a pixel drain electrode PD, a first scan source electrode SSO1, a first scan drain electrode SD1, a second scan source electrode SSO2, a second scan drain electrode SD2, a first light emission source electrode ES1, a first light emission drain electrode ED1, a second light emission source electrode ES2, a second light emission drain electrode ED2, a first initialization voltage line VIL1, a second power supply line VDDL, and a first power connection line VSEL may be located (e.g., formed) on the interlayer insulating film 337. The pixel source electrode PSO, the pixel drain electrode PD, the first scan source electrode SSO1, the first scan drain electrode SD1, the second scan source electrode SSO2, the second scan drain electrode SD2, the first light emission source electrode ES1, the first light emission drain electrode ED1, the second light emission source electrode ES2, and the second light emission drain electrode ED2 may be connected to the pixel active layers PACT, the first scan active layer SACT1, the second scan active layer SACT2, the first light emission active layer EACT1, and the second light emission active layer EACT2, respectively through a contact hole penetrating through the gate insulating film 336 and the interlayer insulating film 337. The first initialization voltage line VIL1, the second power supply line VDDL, and the first power connection line VSEL may be disposed in the non-display area NDA. The first source-drain metal layer may be formed as a single layer (or as a multi-layer structure) including at least one of molybdenum (Mo), aluminum (Al), chromium (Cr), gold (Au), titanium (Ti), nickel (Ni), neodymium (Nd) and copper (Cu), or an alloy thereof.

The protective film 338 for insulating the thin film transistor 335 may be located (e.g., formed) on the first source-drain metal layer. The protective film 338 may be formed of an inorganic film, for example, a silicon oxide (SiOx) film, a silicon nitride (SiNx) film, or a multi-layer film thereof. The protective film 338 may be disposed in the display area DA. The protective film 338 may not overlap the first power supply line VSSL in the third direction (Z-axis direction). Therefore, the protective film 338 may not be disposed on the first power connection line VSEL.

The first organic film 3391 for flattening a step due to the thin film transistor 335 may be located (e.g., formed) on the protective film 338. The first organic film 3391 may be formed as an organic film including an acryl resin, an epoxy resin, a phenolic resin, a polyamide resin, or a polyimide resin.

The second source-drain metal layer including an anode connection electrode ANDE, a second initialization voltage line VIL2, and a first power supply line VSSL may be located (e.g., formed) on the first organic film 3391. The anode connection electrode ANDE may be connected to a first (e.g., source) electrode 341 or a second (e.g., drain) electrode 343 through a contact hole penetrating through the protective film 338 and the first organic film 3391. The second initialization voltage line VIL2 may be connected to the first initialization voltage line VIL1 through a contact hole penetrating through the protective film 338 and the first organic film 3391. An initialization voltage may be applied to the first initialization voltage line VIL1 and the second initialization voltage line VIL2. The first power supply line VSSL may be connected to the first power connection line VSEL through a contact hole penetrating through the first organic film 3391. The second source-drain metal layer may be formed as a single layer (or as a multi-layer structure) including at least one of molybdenum (Mo), aluminum (Al), chromium (Cr), gold (Au), titanium (Ti), nickel (Ni), neodymium (Nd) and copper (Cu), or an alloy thereof.

The second organic film 3392 may be located (e.g., formed) on the second source-drain metal layer. The second organic film 3392 may be formed as an organic film including an acryl resin, an epoxy resin, a phenolic resin, a polyamide resin, or a polyimide resin.

The light emitting element layer EML is located (e.g., formed) on the thin film transistor layer TFTL. The light emitting element layer EML includes light emitting elements and a pixel defining film 340.

The light emitting elements and the pixel defining film 340 are located (e.g., formed) on the second organic film 3392. Each of the light emitting elements may include the first electrode 341, an organic light emitting layer 342, and the second electrode 343.

The first electrode 341 and the first power connection electrode VSEE may be located (e.g., formed) on the second organic film 3392. The first electrode 341 may be connected to the anode connection electrode ANDE through a contact hole penetrating through the second organic film 3392. The first power connection electrode VSEE may be connected to the first power supply line VSSL through a contact hole passing through the second organic film 3392.

In the top emission structure in which light is emitted toward the second electrode 343 based on the organic light emitting layer, the first electrode 341 and the first power connection electrode VSEE may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. The APC alloy is an alloy of silver (Ag), palladium (Pd), and copper (Cu).

The pixel defining film 340 may be located (e.g., formed) on the second organic film 3392 to divide the first electrode 341 so as to define a light emitting area EA of each of the pixels PX. The pixel defining film 340 may be formed to cover the edge of the first electrode 341. The pixel defining film 340 may be formed as an organic film including an acryl resin, an epoxy resin, a phenolic resin, a polyamide resin, or a polyimide resin.

The light emitting area EA refers to an area where the first electrode 341, the organic light emitting layer 342, and the second electrode 343 are sequentially laminated, and holes from the first electrode 341 and electrons from the second electrode 343 are combined with each other in the organic light emitting layer 342 to emit light.

The organic light emitting layer 342 is located (e.g., formed) on the first electrode 341 and the pixel defining film 340. The organic light emitting layer 342 may include an organic material to emit light of a predetermined color (e.g., a set color). For example, the organic light emitting layer 342 may include a hole transporting layer, an organic material layer, and an electron transporting layer.

The second electrode 343 is located (e.g., formed) on the organic light emitting layer 342. The second electrode 343 may be located (e.g., formed) to cover the organic light emitting layer 342. The second electrode 343 may be a common layer commonly located (e.g., formed) in the light emitting areas EA of the pixels PX. A capping layer may be located (e.g., formed) on the second electrode 343.

The second electrode 343 may be connected to the first power connection electrode VSEE in the non-display area NDA. The second electrode 343 may be connected to the first power connection electrode VSEE in an area (or contact hole) from which the pixel defining film 340 is removed.

In the top emission structure, the second electrode 343 may be formed of a transparent conductive material (TCO) such as ITO or IZO, or a semi-transmissive conductive material such as magnesium (Mg), silver (Ag), or an alloy of magnesium (Mg) and silver (Ag). When the second electrode 343 is formed of a semi-transmissive conductive material, light emission efficiency may be increased by microcavities.

The encapsulation film TFE may be located (e.g., formed) on the light emitting element layer EML. The encapsulation film TFE may include at least one inorganic film to prevent (or reduce the chance of) oxygen or moisture from penetrating into the light emitting element layer EML. The encapsulation film TFE may include at least one organic film to protect the light emitting element layer EML from foreign matter such as dust. For example, the encapsulation film TFE may include a first inorganic film 351 disposed on the second electrode 343, an organic film 352 disposed on the first inorganic film 351, and a second inorganic film 353 disposed on the organic film 352.

A dam DAM may be disposed in the non-display area NDA to prevent (or substantially prevent) the organic layer 352 from overflowing. The dam DAM may include a first dam DAM1 formed of the same material as the first organic film 3391, a second dam DAM2 formed of the same material as the second organic film 3392, and a third dam DAM3 formed of the same material as the pixel defining film 340. The end of the organic film 352 may be disposed between the display area DA and the dam DAM. The first inorganic film 351 and the second inorganic film 353 may be disposed on the dam DAM. The first inorganic film 351 and the second inorganic film 353 may be in contact with each other on the dam DAM.

The first power connection line VSEL may be connected to a first power outer line VSOL, and the first power outer line VSOL may extend to the edge of the first corner 300C1. Crack prevention holes CH penetrating through the first power outer line VSOL, the interlayer insulating film 337, and the gate insulating film 336 may be located (e.g., formed) at the edge of the first corner 300C1 to prevent (or reduce the chance of) the propagation of cracks. The first organic film 3391 may be formed to cover the crack prevention holes CH. The crack preventing holes CH may be omitted.

Further, crack prevention layers CCL may be disposed on the same layer as the pixel gate electrode PG, the first scan gate electrode SG1, the second scan gate electrode SG2, the first light emission gate electrode EG1, and the second light emission gate electrode EG2. The crack prevention layers CCL may overlap the first power outer line VSOL in the third direction (Z-axis direction). In some embodiments, the crack preventing layers CCL may be omitted.

As shown in FIGS. 7 and 8, in the non-display area NDA not overlapping the first through hole SH1, the second scan driving transistor SDT2 of the second scan stage SST2 and the second light emission driving transistor EDT2 of the second light emission stage EST2 may overlap the first power supply line VSSL in the third direction (Z-axis direction), whereas, in the non-display area NDA overlapping the first through hole SH1, the first scan driving transistor SDT1 of the first scan stage SST1 and the first light emission driving transistor EDT1 of the first light emission stage EST1 may not overlap the first power supply line VSSL in the third direction (Z-axis direction). Therefore, it is possible to prevent the light incident through the first through hole SH1 from being blocked by the first power supply line VSSL (or reduce the chance of the light incident through the first through hole SH1 from being blocked by the first power supply line VSSL). Therefore, the transmittance of the light incident on the first sensor device 740 through the first through hole SH1 may be increased.

Meanwhile, the dummy scan stages DSST may include dummy scan transistors, and the dummy light emission stages DEST may include dummy light emission transistors. Similar to the first scan driving transistor STD1 of the first scan stage SST1 and the first light emission driving transistor EDT1 of the first light emission stage EST1, shown in FIG. 8, the dummy scan transistors and the dummy light emission transistors may not overlap the first power supply line VSSL in the third direction (Z-axis direction).

Figure 9:
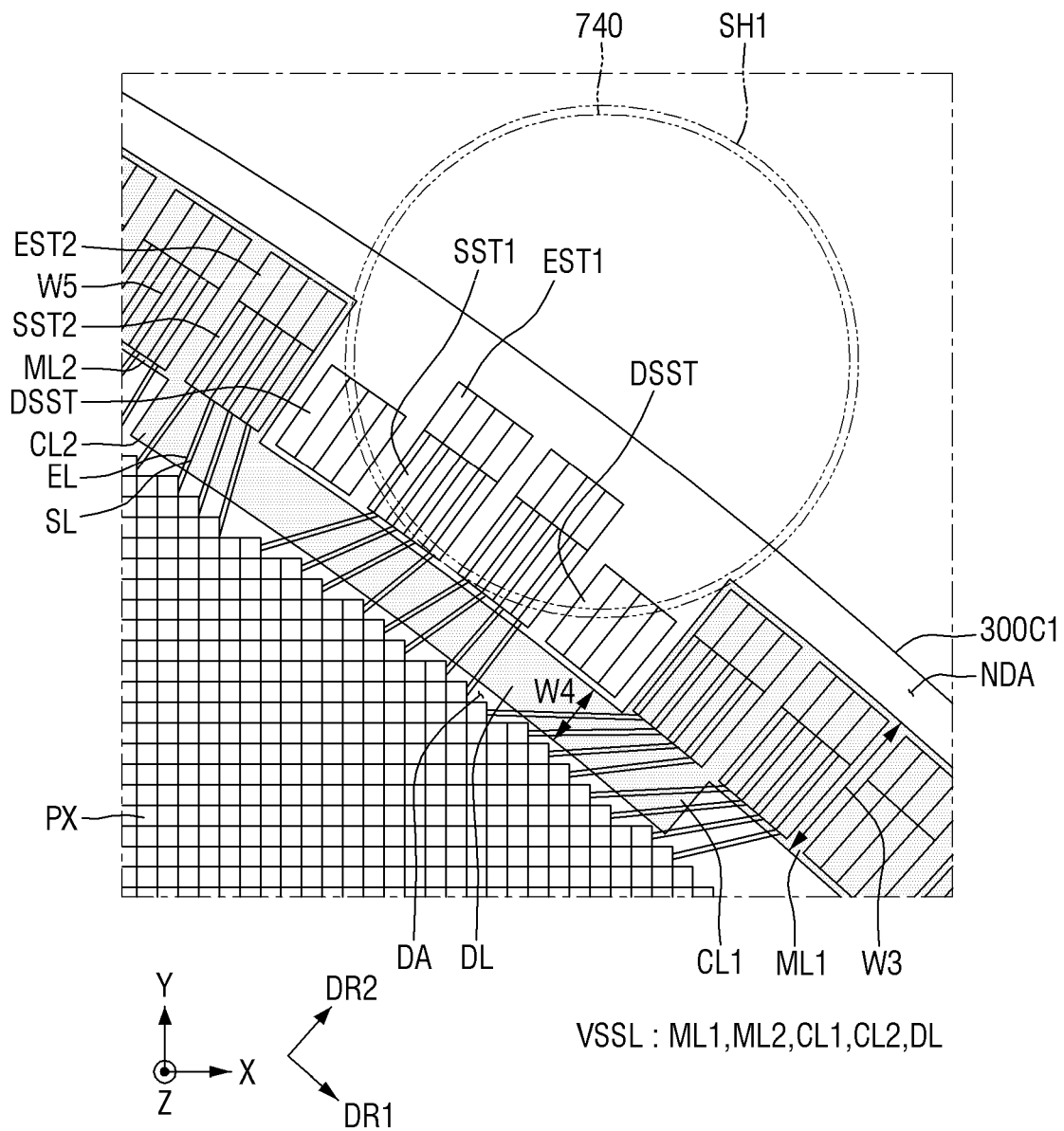
FIG. 9 is a plan view showing another example of a first corner of a display panel, overlapping a first through hole, according to some example embodiments of the present disclosure.

FIG. 9 is a plan view showing another example of a first corner of a display panel, overlapping a first through hole.

The embodiment of FIG. 9 is different from the aforementioned embodiment of FIG. 5 in that the dummy light emission stages DEST overlapping the first through hole SH1 and the first sensor device 740 in the third direction (Z-axis direction) are omitted.

As shown in FIG. 9, when the dummy light emission stages DEST overlapping the first through hole SH1 and the first sensor device 740 in the third direction (Z-axis direction) are omitted, it is possible to prevent the light incident through the first through hole SH1 from being blocked by the dummy light emission transistors of the dummy light emission stages DEST (or reduce the chance of the light incident through the first through hole SH1 from being blocked by the dummy light emission transistors of the dummy light emission stages DEST). Therefore, the transmittance of the light incident on the first sensor device 740 through the first through hole SH1 may be increased.

Meanwhile, although it is shown in FIG. 9 that the dummy light emission stages DEST overlapping the first through hole SH1 and the first sensor device 740 in the third direction (Z-axis direction) are omitted, the present disclosure is not limited thereto. For example, the dummy scan stages DSST overlapping the first through hole SH1 and the first sensor device 740 in the third direction (Z-axis direction) may be omitted.

Figure 10:
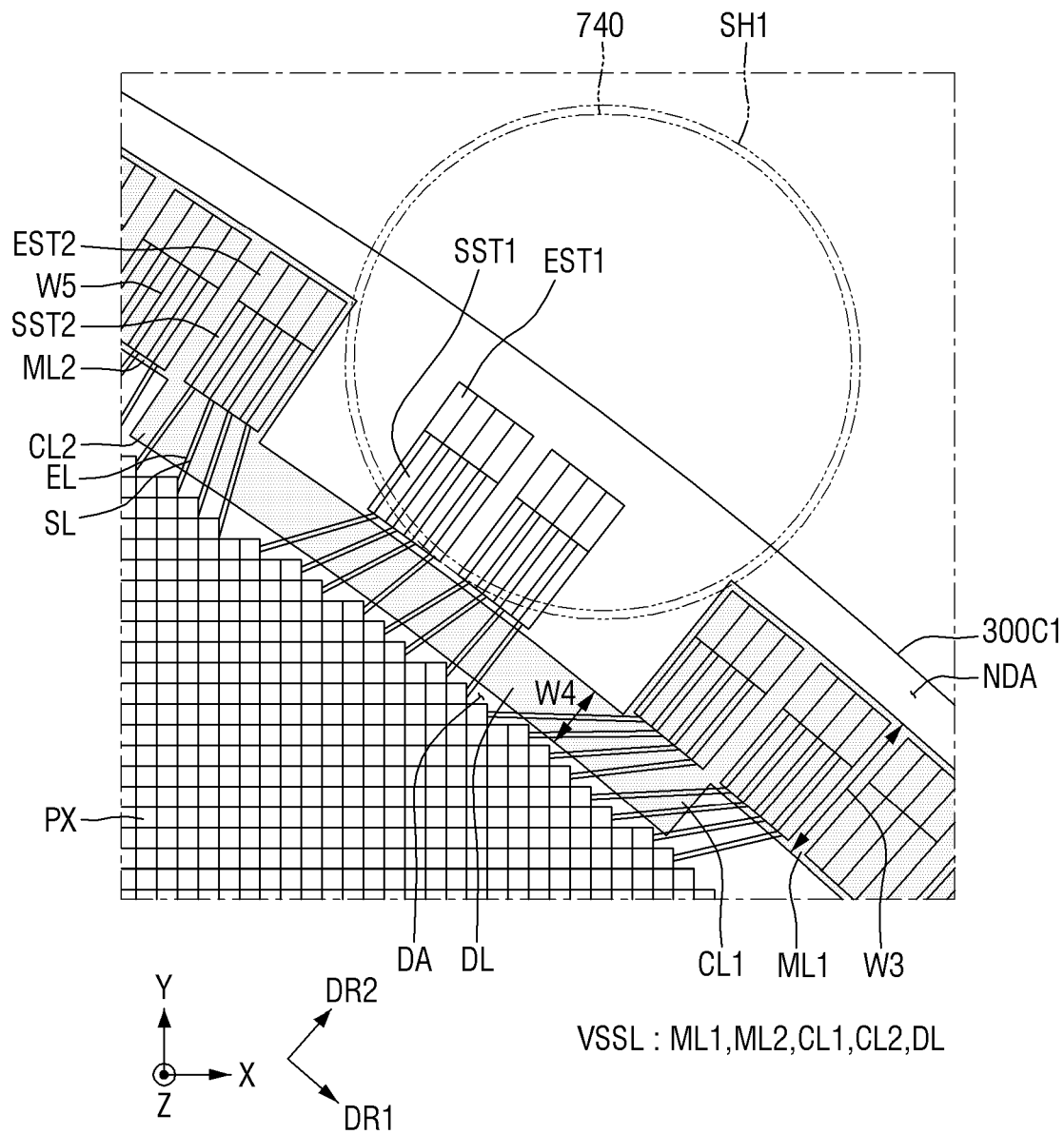
FIG. 10 is a plan view showing still another example of a first corner of a display panel, overlapping a first through hole, according to some example embodiments of the present disclosure.

FIG. 10 is a plan view showing still another example of a first corner of a display panel, overlapping a first through hole.

The embodiment of FIG. 10 is different from the aforementioned embodiment of FIG. 5 in that the dummy scan stages DSST and dummy light emission stages DEST overlapping the first through hole SH1 and the first sensor device 740 in the third direction (Z-axis direction) are omitted.

As shown in FIG. 10, when the dummy scan stages DSST and dummy light emission stages DEST overlapping the first through hole SH1 and the first sensor device 740 in the third direction (Z-axis direction) are omitted, it is possible to prevent the light incident through the first through hole SH1 from being blocked by the dummy scan transistors of the dummy scan stages DSST and the dummy light emission transistors of the dummy light emission stages DEST (or reduce the chance of the light incident through the first through hole SH1 from being blocked by the dummy scan transistors of the dummy scan stages DSST and the dummy light emission transistors of the dummy light emission stages DEST). Therefore, the transmittance of the light incident on the first sensor device 740 through the first through hole SH1 may be increased.

Figure 11:
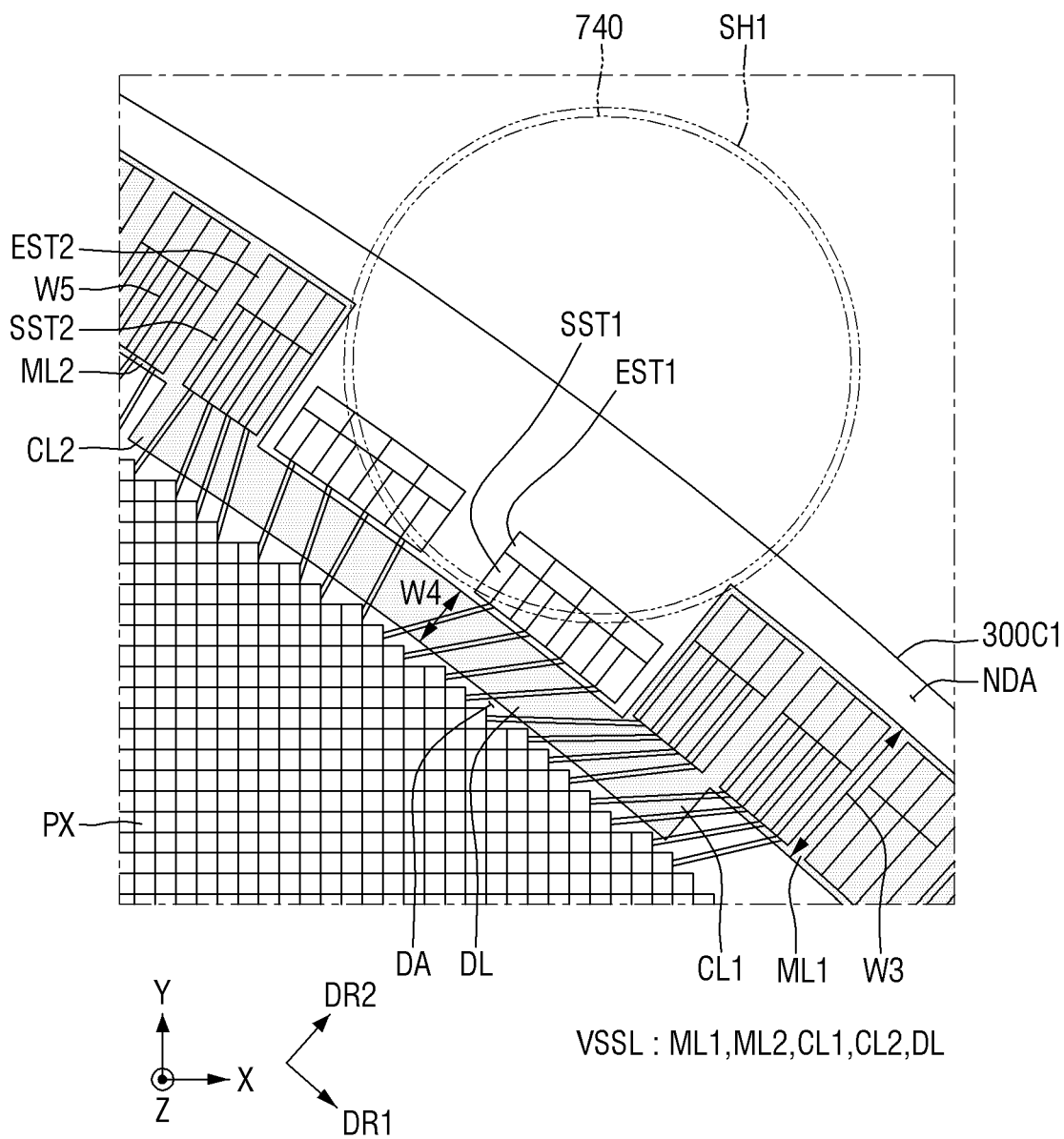
FIG. 11 is a plan view showing still another example of a first corner of a display panel, overlapping a first through hole, according to some example embodiments of the present disclosure.

FIG. 11 is a plan view showing still another example of a first corner of a display panel, overlapping a first through hole.

The embodiment of FIG. 11 is different from the aforementioned embodiment of FIG. 10 in that the first scan stages SST1 and the first light emission stages EST1 are rearranged.

Referring to FIG. 11, when the dummy scan stages DSST and the dummy light emission stages DEST are omitted, a space in which the first scan stages SST1 and the first light emission stages EST1 may be disposed in one direction DR1 may be increased. Therefore, in order to reduce an area where the first scan stages SST1 and the first light emission stages EST1 overlap the first through hole SH1 and the first sensor device 740 in the third direction (Z-axis direction), the length of the first scan stage SST1 in one direction DR1 may be longer than the length of the second scan stage SST2 in one direction DR1, and the length of the first light emission stage EST1 one direction DR1 may be longer than the length of the second light emission stage EST2 in one direction DR1. In this case, the length of the first scan stage SST1 in the other direction DR2 may be shorter than the length of the second scan stage SST2 in the other direction DR2, and the length of the first light emission stage EST1 the other direction DR2 may be shorter than the length of the second light emission stage EST2 the other direction DR2.

As shown in FIG. 11, the length of the first scan stage SST1 in one direction DR1 may be longer than the length of the second scan stage SST2 in one direction DR1, thereby preventing the light incident through the first through hole SH1 from being blocked by the first scan driving transistors SDT1 of the first scan stage SST1 and the first light emission driving transistors EDT1 of the first light emission stage EST1 (or reducing the chance of the light incident through the first through hole SH1 from being blocked by the first scan driving transistors SDT1 of the first scan stage SST1 and the first light emission driving transistors EDT1 of the first light emission stage EST1). Therefore, the transmittance of the light incident on the first sensor device 740 through the first through hole SH1 may be further increased.

Further, because the distance between the first scan stage SST1 and the second scan stage SST2 may be reduced, due to the omission of the dummy scan stages DSST, it is possible to reduce or prevent (or protect) the active layers, gate electrodes, source electrodes, and drain electrodes of some transistors of the first scan stage SST1 and second scan stage SST2 adjacent to each other from being over-etched.

Figure 12:
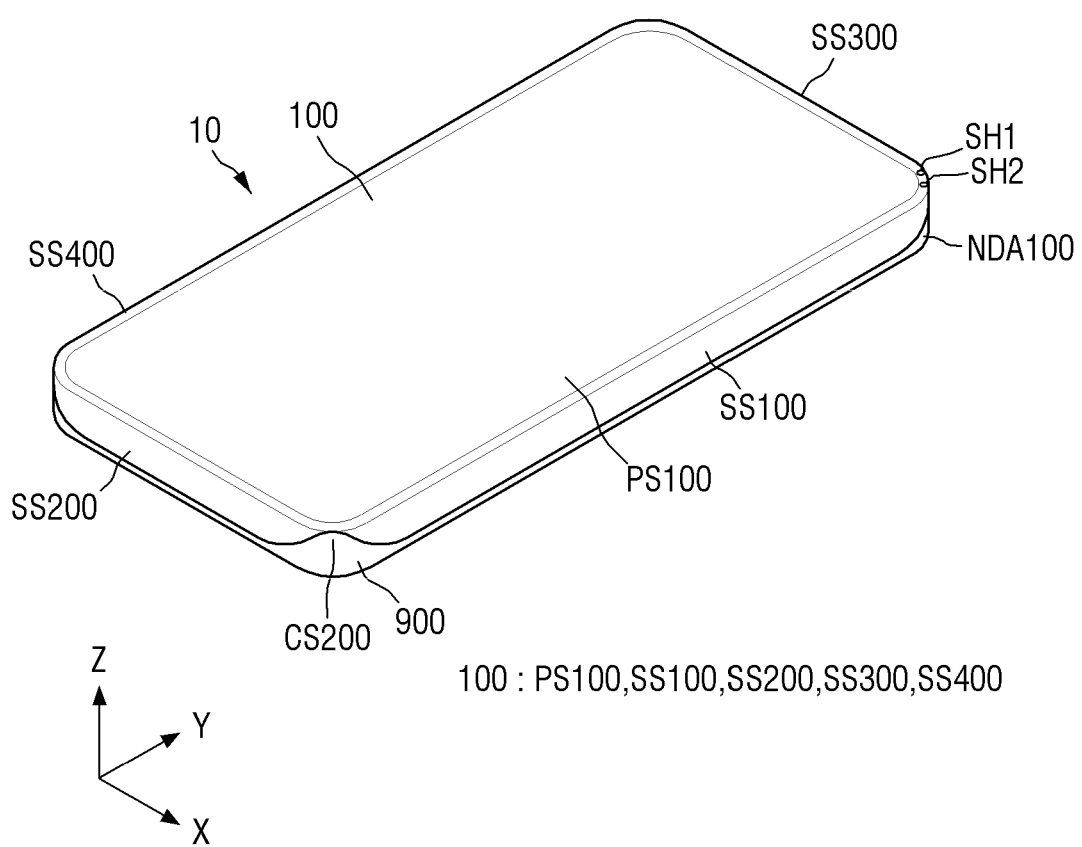
FIG. 12 is a perspective view of a display device according to some example embodiments of the present disclosure.
Figure 13:
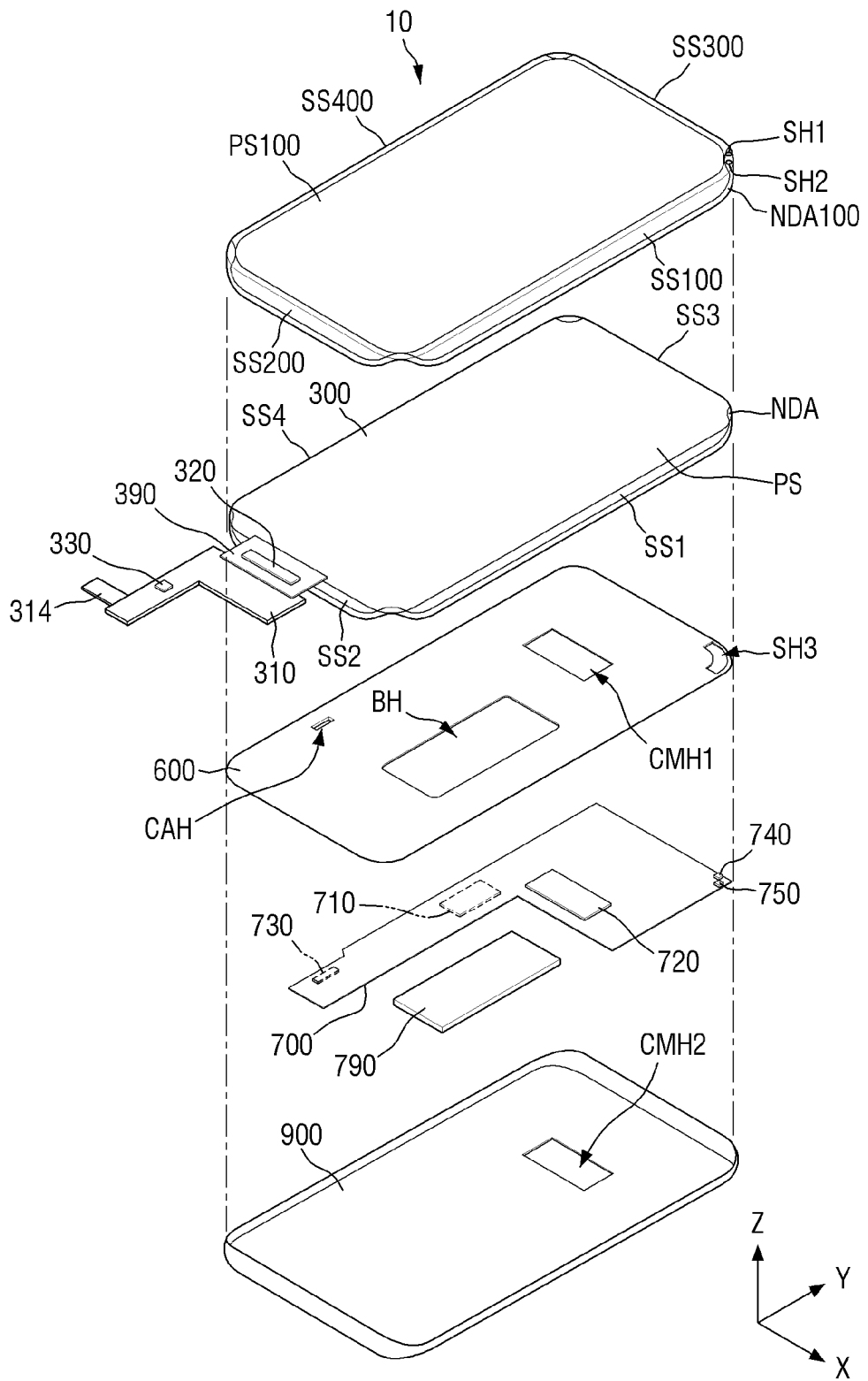
FIG. 13 is an exploded perspective view of a display device according to some example embodiments of the present disclosure.

FIG. 12 is a perspective view of a display device according to some embodiments of the present disclosure, and FIG. 13 is an exploded perspective view of a display device according to some embodiments of the present disclosure.

The embodiment of FIGS. 12 and 13 is different from the aforementioned embodiment of FIGS. 1 and 2 in that images are displayed on the side surfaces of the display device 10.

Referring to FIGS. 12 and 13, the cover window 100 may include an upper surface portion PS100, a first side surface portion SS100, a second side surface portion SS200, a third side surface portion SS300, a fourth side surface portion SS400, and a light blocking portion NDA100.

The upper surface portion PS100 of the cover window 100 may have a rectangular planar shape having short sides in the first direction (X-axis direction) and long sides in the second direction (Y-axis direction), but the planar shape thereof is not limited thereto. The upper surface portion PS100 may have a planar shape of another polygon, a circle, or an oval. The corners where the long side meets the short side in the upper surface portion may be formed to be bent with a predetermined (or set) curvature. Although it is shown in FIGS. 12 and 13 that the upper surface portion PS100 is formed to be flat, the present disclosure is not limited thereto. The upper surface portion PS100 may include a curved surface.

The upper surface portion PS100, the first side surface portion SS100, the second side surface portion SS200, the third side surface portion SS300, and the fourth side surface portion SS400 of the cover window 100 may be formed as a transmission portion that transmits light. In contrast, the light blocking portion NDA100 of the cover window 100 may block light.

The first side surface portion SS100 of the cover window 100 may extend from the first side of the upper surface portion PS100. For example, as shown in FIGS. 12 and 13, the first side surface portion SS100 may extend from the right side of the upper surface portion PS100, and may be a right side surface portion of the cover window 100.

The second side surface portion SS200 of the cover window 100 may extend from the second side of the upper surface portion PS100. For example, as shown in FIGS. 12 and 13, the second side surface portion SS200 may extend from the lower side of the upper surface portion PS100, and may be a lower side surface portion of the cover window 100.

The third side surface portion SS300 of the cover window 100 may extend from the third side of the upper surface portion PS100. For example, as shown in FIGS. 12 and 13, the third side surface portion SS300 may extend from the upper side of the upper surface portion PS100, and may be an upper side surface portion of the cover window 100.

The fourth side surface portion SS400 of the cover window 100 may extend from the fourth side of the upper surface portion PS100. For example, as shown in FIGS. 12 and 13, the fourth side surface portion SS400 may extend from the left side of the upper surface portion PS100, and may be a left side surface portion of the cover window 100.

The light blocking portion NDA100 of the cover window 100 may be disposed at an edge of the first side surface portion SS100, an edge of the second side surface portion SS200, an edge of the third side surface portion SS300, an edge of the fourth side surface portion SS400, and corners of the upper surface portion PS100. Specifically, the light blocking portion NDA100 of the cover window 100 may be disposed at the upper edge, right edge, and lower edge of the first side surface portion SS100, may be disposed at the left edge, lower edge, and right edge of the second side surface portion SS200, may be disposed at the left edge, lower edge, and right edge of the third side surface portion SS300, and may be disposed at the upper edge, left edge, and right edge of the fourth side surface portion SS400. Further, the light blocking portion NDA100 of the cover window 100 may be disposed at the first corner of the upper surface portion PS100 connecting the upper edge of the first side surface portion SS100 and the right edge of the third side surface portion SS300, the second corner of the upper surface portion PS100 connecting the lower edge of the first side surface portion SS100 and the right edge of the second side surface portion SS200, the third corner of the upper surface portion PS100 connecting the upper edge of the fourth side surface portion SS400 and the left edge of the third side surface portion SS300, and the fourth corner of the upper surface portion PS100 connecting the lower edge of the fourth side surface portion SS400 and the left edge of the second side surface portion SS200.

The cover window 100 may include through holes SH1 and SH2 penetrating through the light blocking portion NDA100. The through holes SH1 and SH2 may be disposed at at least one of the corners of the upper surface portion PS100 of the cover window 100. For example, as shown in FIG. 13, the through holes SH1 and SH2 may be disposed at the corner where the upper short side and right long side of the upper surface portion PS100 of the cover window 100 meet each other, but the present disclosure is not limited thereto. For example, one through hole may be disposed at the corner of the upper surface portion PS100 of the cover window 100. Alternatively, one through hole may be disposed at one corner of the upper surface PS100 of the cover window 100, and another through hole may be disposed at another corner of the upper surface portion PS100 of the cover window 100. Alternatively, some through holes may be disposed at any corner of the upper surface portion PS100 of the cover window 100, and other through holes may be disposed at another corner of the upper surface portion PS100 of the cover window 100.

As shown in FIG. 13, the display panel 300 includes an upper surface portion PS, a first side surface portion SS1, a second side surface portion SS2, a third side surface portion SS3, a fourth side surface portion SS4, and a non-display portion NDA.

The upper surface portion PS of the display panel 300 may have a rectangular planar shape having short sides in the first direction (X-axis direction) and long sides in the second direction (Y-axis direction), but the planar shape thereof is not limited thereto. The upper surface portion PS100 may have a planar shape of another polygon, a circle, or an oval. The corners where the long side meets the short side in the upper surface portion may be formed to be bent with a predetermined (e.g., set) curvature. Although it is shown in FIG. 13 that the upper surface portion PS is formed to be flat, the present disclosure is not limited thereto. The upper surface portion PS may include a curved surface.

The upper surface portion PS, the first side surface portion SS1, the second side surface portion SS2, the third side surface portion SS3, and the fourth side surface portion SS4 of the display panel 300 may be formed as a display portion that includes pixels to display an image. In contrast, the non-display portion NDA of the display panel 300 may not include pixels, and may not display an image.

The first side surface portion SS1 of the display panel 300 may extend from the first side of the upper surface portion PS. For example, as shown in FIG. 13, the first side surface portion SS1 may extend from the right side of the upper surface portion PS. The first side surface portion SS1 may be a right side surface portion of the display panel 300.

The second side surface portion SS2 of the display panel 300 may extend from the second side of the upper surface portion PS. For example, as shown in FIG. 13, the second side surface portion SS2 may extend from the lower side of the upper surface portion PS. The second side surface portion SS2 may be a lower side surface portion of the display panel 300.

The third side surface portion SS3 of the display panel 300 may extend from the third side of the upper surface portion PS. For example, as shown in FIG. 13, the third side surface portion SS3 may extend from the upper side of the upper surface portion PS. The third side surface portion SS3 may be an upper side surface portion of the display panel 300.

The fourth side surface portion SS4 of the display panel 300 may extend from the fourth side of the upper surface portion PS. For example, as shown in FIG. 13, the fourth side surface portion SS4 may extend from the right side of the upper surface portion PS. The fourth side surface portion SS4 may be a right side surface portion of the display panel 300.

The non-display portion NDA of the display panel 300 may be disposed at an edge of the first side surface portion SS1, an edge of the second side surface portion SS2, an edge of the third side surface portion SS3, an edge of the fourth side surface portion SS4, and corners of the upper surface portion PS. Specifically, the non-display portion NDA of the display panel 300 may be disposed at the upper edge, right edge, and lower edge of the first side surface portion SS1, may be disposed at the left edge, lower edge, and right edge of the second side surface portion SS2, may be disposed at the left edge, lower edge, and right edge of the third side surface portion SS3, and may be disposed at the upper edge, left edge, and right edge of the fourth side surface portion SS4. Further, the non-display portion NDA of the display panel 300 may be disposed at the first corner of the upper surface portion PS connecting the upper edge of the first side surface portion SS1 and the right edge of the third side surface portion SS3, the second corner of the upper surface portion PS connecting the lower edge of the first side surface portion SS1 and the right edge of the second side surface portion SS2, the third corner of the upper surface portion PS connecting the upper edge of the fourth side surface portion SS4 and the left edge of the third side surface portion SS3, and the fourth corner of the upper surface portion PS connecting the lower edge of the fourth side surface portion SS4 and the left edge of the second side surface portion SS2.

The flexible film 390 may be attached to the non-display portion NDA of the lower edge of the second side surface portion SS2.

Figure 14:
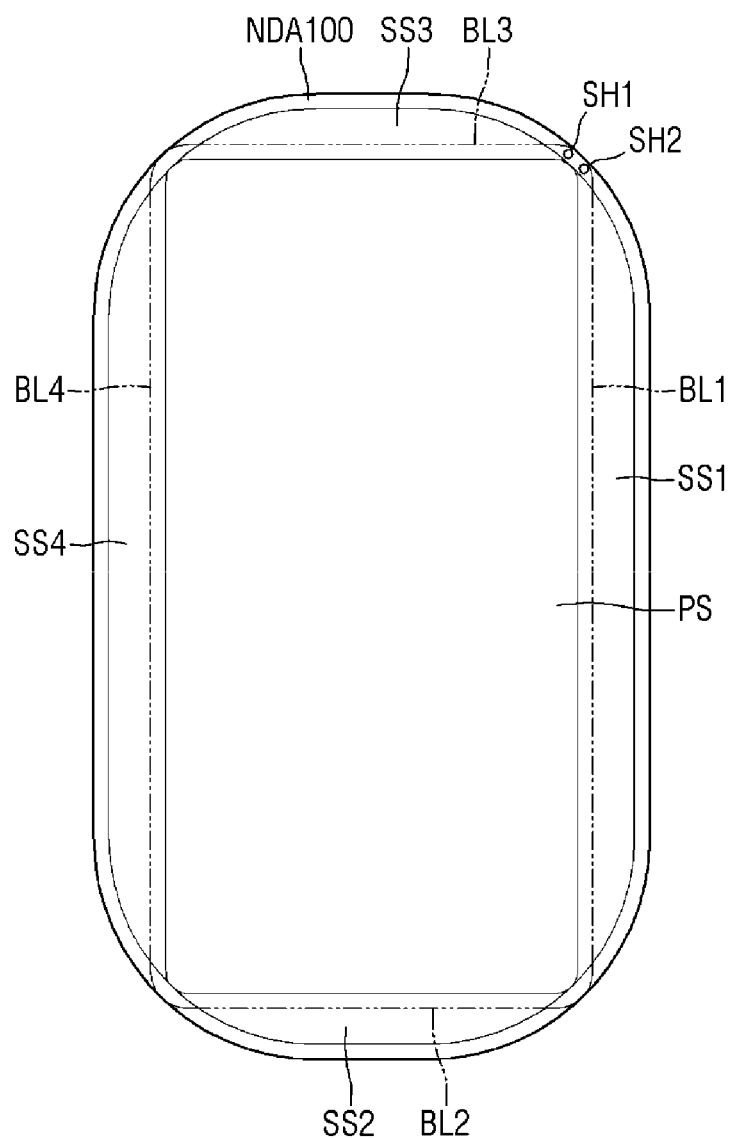
FIG. 14 is a developed view showing a display panel and a cover window according to some example embodiments of the present disclosure.
Figure 15:
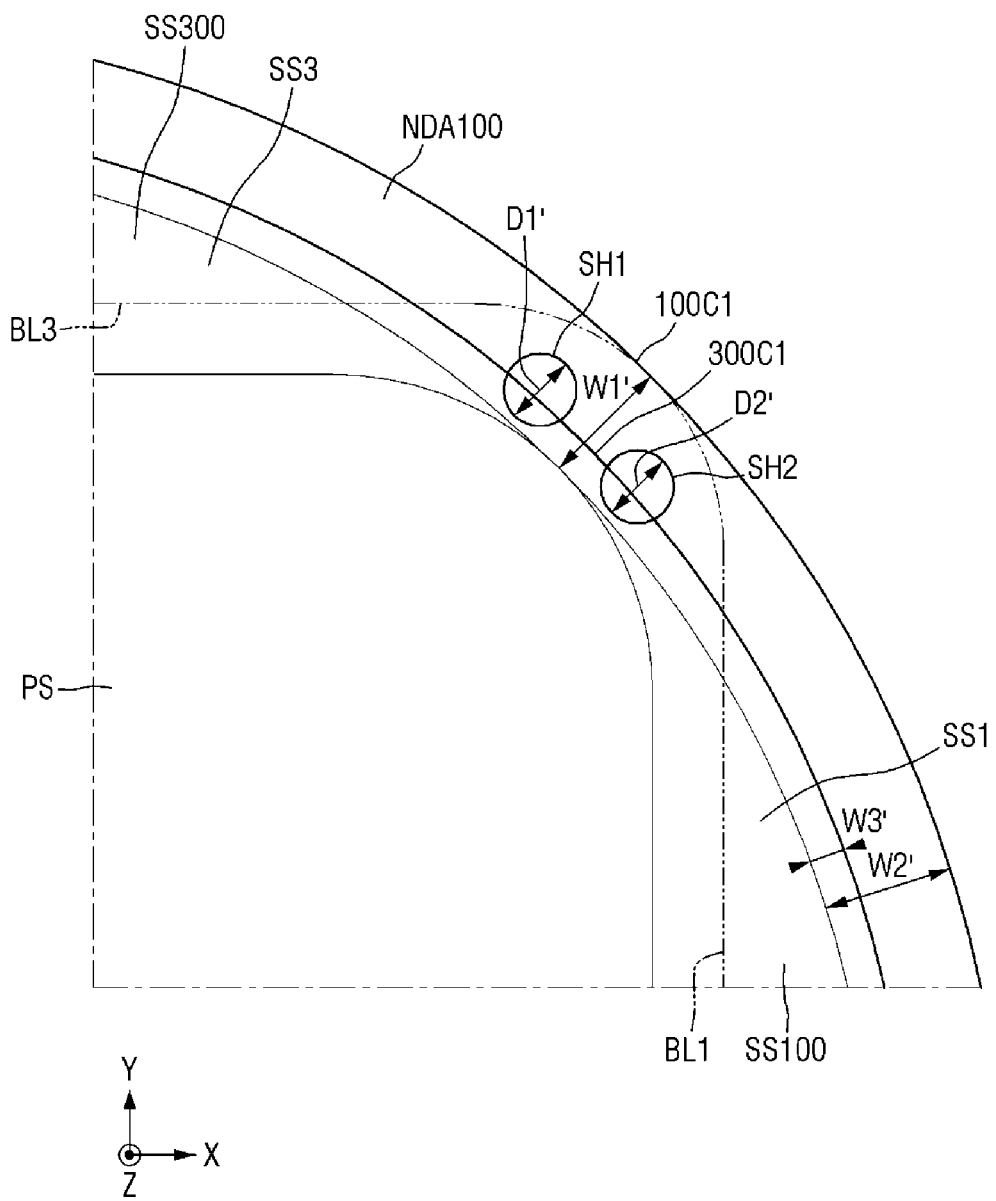
FIG. 15 is a plan view specifically showing a first corner of the display panel and cover window of FIG. 14, according to some example embodiments of the present disclosure.

FIG. 14 is a developed view showing a display panel and a cover window according to some embodiments of the present disclosure, and FIG. 15 is a plan view specifically showing a first corner of the display panel and cover window of FIG. 14.

Referring to FIGS. 14 and 15, the first side surface portion SS1 of the display panel 300 may be bent from a first bending line BL1. The first bending line BL1 may be a boundary between the upper surface portion PS of the display panel 300 and the first side surface portion SS1 of the display panel 300.

The second side surface portion SS2 of the display panel 300 may be bent from a second bending line BL2. The second bending line BL2 may be a boundary between the upper surface portion PS of the display panel 300 and the second side surface portion SS2 of the display panel 300.

The third side surface portion SS3 of the display panel 300 may be bent from a third bending line BL3. The third bending line BL3 may be a boundary between the upper surface portion PS of the display panel 300 and the third side surface portion SS3 of the display panel 300.

The fourth side surface portion SS4 of the display panel 300 may be bent from a fourth bending line BL4. The fourth bending line BL4 may be a boundary between the upper surface portion PS of the display panel 300 and the fourth side surface portion SS4 of the display panel 300.

The light blocking portion NDA100 of the cover window 100 may overlap the non-display portion NDA of the display panel 300 in the third direction (Z-axis direction). The maximum width W1' of the light blocking portion NDA100 of the cover window 100 may be wider than the maximum width W3' of the non-display portion NDA of the display panel 300. The diameter D1' of the first through hole SH1 and the diameter D2' of the second through hole SH2 may be smaller than the maximum width W1' of the light blocking portion NDA100 of the cover window 100.

Each of the first through hole SH1 and the second through hole SH2 may be formed to penetrate through the light blocking portion NDA100 of the cover window 100. A part of the first through hole SH1 and a part of the second through hole SH2 may overlap the non-display portion NDA of the display panel 300 in the third direction (Z-axis direction).

In order to increase the transmittance of the first through hole SH1, the area of the first through hole SH1 overlapping the non-display portion NDA of the display panel 300 may be smaller than the area of the first through hole SH1 not overlapping the non-display portion NDA of the display panel 300. In order to increase the transmittance of the second through hole SH2, the area of the second through hole SH2 overlapping the non-display portion NDA of the display panel 300 may be smaller than the area of the second through hole SH2 not overlapping the non-display portion NDA of the display panel 300.

As shown in FIGS. 14 and 15, the first through hole SH1 and the second through hole SH2 penetrate through the light blocking portion NDA100 of the cover window 100 and overlap the non-display portion NDA of the display panel 300. That is, because the first through hole SH1 and the second through hole SH2 are not disposed in the display unit such as the upper surface portion PS, first side surface portion SS1, second side surface portion SS2, third side surface portion SS3, and fourth side surface portion SS4 of the display panel 300, the deterioration of aesthetic feelings due to the through holes disposed in the display unit of the display panel 300 may be prevented (or reduced). Further, because the through holes are not disposed in the display unit of the display panel 300, it is easy to design wirings. Further, because a sensor device does not need to be disposed to overlap the display unit of the display panel 300 in the third direction (Z-axis direction), it is not needed to remove pixels due to the first and second through holes SH1 and SH2. Therefore, it is possible to prevent (or reduce) the resolution of the display unit of the display panel 300 from being lowered.

Meanwhile, because the first corner of the upper surface portion PS of the display panel 300 overlapping the first through hole SH1 or the second through hole SH2 may be formed substantially the same as that described with reference to FIGS. 5-11, a detailed description thereof will be omitted, as one of the ordinary skilled in the art would be able to describe from the detailed description of FIGS. 5-11.

Although the example embodiments of the present disclosure have been disclosed for illustrative purposes, those skilled in the art will appreciate that various modifications, additions and substitutions are possible, without departing from the scope and spirit of the invention as disclosed in the accompanying claims, and equivalents thereof.

What is claimed is:

1. A display device, comprising:
    a display panel comprising a display area in which pixels are arranged to display an image, and a non-display area located around the display area; and
    a cover window comprising a light blocking area overlapping the non-display area of the display panel in a thickness direction of the display panel, and a through hole penetrating through the light blocking area,
    wherein the display panel further comprises a first power supply line located in the non-display area to apply a first power supply voltage, and
    wherein the first power supply line does not overlap the through hole in the thickness direction of the display panel.

2. The display device of claim 1, wherein the display panel further comprises:
    scan lines arranged in the display area and connected to the pixels; and
    scan stages arranged in the non-display area and connected to the scan lines to apply scan signals.

3. The display device of claim 2, wherein the scan stages comprise:
    first scan stages overlapping the through hole in the thickness direction of the display panel; and
    second scan stages not overlapping the through hole in the thickness direction of the display panel.

4. The display device of claim 3, wherein the first power supply line overlaps the second scan stages in the thickness direction of the display panel.

5. The display device of claim 3, wherein the first power supply line does not overlap the first scan stages in the thickness direction of the display panel.

6. The display device of claim 3, wherein the display panel further comprises dummy scan stages located between corresponding scan stages adjacent to each other in one direction from among the scan stages in the non-display area.

7. The display device of claim 6, wherein the dummy scan stages overlap the through hole in the thickness direction of the display panel.

8. The display device of claim 7, wherein the first power supply line does not overlap the dummy scan stages.

9. The display device of claim 6, wherein the dummy scan stages do not overlap the through hole in the thickness direction of the display panel.

10. The display device of claim 3,
    wherein a length of any one of the first scan stages in one direction is longer than a length of any one of the second scan stages in the one direction, and
    wherein a length of any one of the first scan stages in the other direction is shorter than a length of any one of the second scan stages in the other direction crossing the one direction.

11. The display device of claim 2, wherein the display panel further comprises:
    light emission lines connected to the pixels and located in the display area; and
    light emission stages connected to the light emission lines to apply light emission signals.

12. The display device of claim 11, wherein the light emission stages comprise:
    first light emission stages overlapping the through hole in the thickness direction of the display panel; and
    second light emission stages not overlapping the through hole in the thickness direction of the display panel.

13. The display device of claim 12, wherein the first power supply line overlaps the second light emission stages in the thickness direction of the display panel.

14. The display device of claim 12, wherein the first power supply line does not overlap the first light emission stages.

15. The display device of claim 12,
    wherein a length of any one of the first light emission stages in one direction is longer than a length of any one of the second light emission stages in the one direction, and
    wherein a length of any one of the first light emission stages in the other direction is shorter than a length of any one of the second light emission stages in the other direction crossing the one direction.

16. The display device of claim 11, wherein the display panel further comprises dummy light emission stages located between corresponding light emission stages adjacent to each other in one direction from among the light emission stages in the non-display area.

17. The display device of claim 16, wherein the dummy light emission stages do not overlap the through hole in the thickness direction of the display panel.

18. The display device of claim 16, wherein the dummy light emission stages overlap the through hole in the thickness direction of the display panel.

19. The display device of claim 18, wherein the first power supply line does not overlap the dummy light emission stages in the thickness direction of the display panel.

20. The display device of claim 1, wherein the through hole overlaps a corner of the display panel in the thickness direction of the display panel.

21. The display device of claim 1, further comprising:
    a sensor device overlapping the through hole in the thickness direction of the display panel and sensing light.

22. A display device, comprising:
    a display panel comprising a display area in which pixels are placed to display an image, and a non-display area located around the display area;
    a sensor device overlapping the non-display area of the display panel in a thickness direction of the display panel to sense light; and
    a cover window comprising a light blocking area overlapping the non-display area of the display panel in the thickness direction of the display panel, and a through hole penetrating through the light blocking area,
    wherein the display panel further comprises a first power supply line located in the non-display area to apply a first power supply voltage,
    wherein the through hole overlaps the sensor device in the thickness direction of the display panel, and wherein the first power supply line does not overlap the sensor device in the thickness direction of the display panel.

* * * * *